United States Patent
Duan et al.

(10) Patent No.: US 10,566,542 B2
(45) Date of Patent: Feb. 18, 2020

(54) ORGANIC ELECTROLUMINESCENT DEVICE

(71) Applicants: BEIJING VISIONOX TECHNOLOGY CO., LTD., Beijing (CN); TSINGHUA UNIVERSITY, Beijing (CN)

(72) Inventors: Lian Duan, Beijing (CN); Yong Qiu, Beijing (CN); Guohui Zhang, Beijing (CN); Man Li, Beijing (CN); Dongdong Zhang, Beijing (CN); Yonglan Hu, Beijing (CN)

(73) Assignees: BEIJING VISIONOX TECHNOLOGY CO., LTD., Beijing (CN); TSINGHUA UNIVERSITY, Beijing (CN)

( * ) Notice: Subject to any disclaimer, the term of this patent is extended or adjusted under 35 U.S.C. 154(b) by 200 days.

(21) Appl. No.: 15/541,357

(22) PCT Filed: Dec. 22, 2015

(86) PCT No.: PCT/CN2015/098162
§ 371 (c)(1),
(2) Date: Jun. 30, 2017

(87) PCT Pub. No.: WO2016/107446
PCT Pub. Date: Jul. 7, 2016

(65) Prior Publication Data
US 2017/0352813 A1 Dec. 7, 2017

(30) Foreign Application Priority Data
Dec. 31, 2014 (CN) .......................... 2014 1 0846786

(51) Int. Cl.
*H01L 51/00* (2006.01)
*C09K 11/06* (2006.01)
(Continued)

(52) U.S. Cl.
CPC .......... *H01L 51/0067* (2013.01); *C09K 11/06* (2013.01); *H01L 51/0072* (2013.01);
(Continued)

(58) Field of Classification Search
CPC .................................................. H01L 51/5016
See application file for complete search history.

(56) References Cited

U.S. PATENT DOCUMENTS

2015/0188056 A1 7/2015 Suda
2016/0064676 A1 3/2016 Adachi et al.

FOREIGN PATENT DOCUMENTS

| CN | 1585580 A | 2/2005 |
|---|---|---|
| CN | 101584057 A | 11/2009 |

(Continued)

OTHER PUBLICATIONS

Baldo et al., "Excitonic singlet-triplet ratio in a semiconducting organic thin film", Phys. Rev. B, vol. 60, Issue 20, 1999, pp. 14422-14428.

(Continued)

*Primary Examiner* — Peter F Godenschwager
(74) *Attorney, Agent, or Firm* — Maschoff Brennan

(57) ABSTRACT

The present invention discloses an organic electroluminescence device, comprising a luminescent layer, wherein, a host material of the luminescent layer comprises a thermally activated delayed fluorescence material, the host material is doped by a dye, and the dye comprises at least one phosphorescent dye. The present invention employs a thermally activated delayed fluorescence material, whose difference between the triplet state energy level and the singlet state energy level ($\Delta E_{ST}$) is relatively small. The present invention employs the material as the phosphorescence host, so part of the triplet state exciton level transfers to the singlet state excitons, and the amount of the overall triplet state excitons is smaller. Therefore, the concentration of the triplet state excitons decreases, and the recombination region becomes narrower, which effectively reduces the probability of excitons entering the charge transport layer, and at the same time the narrowing of the recombination region effective prevents the diffusion of N-type dopants into the exciton recombination region. Additionally, by employing the host material, the device corresponds to a low working voltage.

10 Claims, 3 Drawing Sheets

(51) Int. Cl.
*H01L 51/50* (2006.01)
*H01L 51/52* (2006.01)

(52) U.S. Cl.
CPC .. *H01L 51/0085* (2013.01); *C09K 2211/1018* (2013.01); *C09K 2211/1029* (2013.01); *C09K 2211/185* (2013.01); *H01L 51/0097* (2013.01); *H01L 51/5016* (2013.01); *H01L 51/5056* (2013.01); *H01L 51/5072* (2013.01); *H01L 51/5088* (2013.01); *H01L 51/5206* (2013.01); *H01L 51/5221* (2013.01); *H01L 2251/5338* (2013.01)

(56) References Cited

FOREIGN PATENT DOCUMENTS

| CN | 101635334 A | 1/2010 |
|---|---|---|
| CN | 101669226 A | 3/2010 |
| EP | 2 980 876 A1 | 2/2016 |
| JP | 2005-100957 A | 4/2005 |
| JP | 2005-213188 A | 8/2005 |
| JP | 2007-305783 A | 11/2007 |
| JP | 2010-522745 A | 7/2010 |
| JP | 2013-253121 A | 12/2013 |
| JP | 2014-075249 A | 4/2014 |
| KR | 10-2014-0043036 A | 4/2014 |
| TW | 201434828 A | 9/2014 |
| WO | 2008/120355 A1 | 10/2008 |
| WO | 2010/098246 A1 | 9/2010 |
| WO | 2012/099241 A1 | 7/2012 |
| WO | 2014/002629 A1 | 1/2014 |
| WO | 2014/015931 A1 | 1/2014 |
| WO | 2014/129330 A1 | 8/2014 |
| WO | 2014/157610 A1 | 10/2014 |
| WO | 2014/163083 A1 | 10/2014 |

OTHER PUBLICATIONS

Lee et al., "High-efficiency organic light-emitting diodes utilizing thermally activated delayed fluorescence from triazine-based donor-acceptor hybrid molecules", Applied Physics Letters, vol. 101, Issue 9, 2012, pp. 093306 (1)-093306 (4).

Lee et al., "Oxadiazole- and triazole-based highly-efficient thermally activated delayed fluorescence emitters for organic light-emitting diodes", Journal of Materials Chemistry C, vol. 1, 2013, pp. 4599-4604.

Li et al., "Employing ~100% Excitons in OLEDs by Utilizing a Fluorescent Molecule with Hybridized Local and Charge-Transfer Excited State", Advanced Functional Materials, vol. 24 2014, DOI: 10.1002/adfm.201301750, pp. 1609-1614.

Mé,hes et al.,"Enhanced electroluminescence efficiency in a spiro-acridine derivative through thermally activated delayed fluorescence", Angew Chem, vol. 51, Issue 45, Nov. 2012, pp. 11311-11315.

Nakagawa et al., "Electroluminescence based on thermally activated delayed fluorescence generated by a spirobifluorene donor-acceptor structure", Chemical Communications, vol. 48, Issue 77, Apr. 2012, pp. 9580-9582.

Ro, et al., "Production of the antimalarial drug precursor artemisinic acid in engineered yeast", Nature Letters, vol. 440 Apr. 2006, pp. 940-943.

Sato et al., "Organic Luminescent Molecule with Energetically Equivalent Singlet and Triplet Excited States for Organic Light-Emitting Diodes", Physical Review Letters, vol. 110, Issue 24, 2013, p. 247401.

Serevičius et al., "Enhanced electroluminescence based on thermally activated delayed fluorescence from a carbazole-triazine derivative", Phys. Chem. Chem. Phys., vol. 15, Issue 38, 2013, pp. 15850-15855.

Tanaka et al., "Efficient green thermally activated delayed fluorescence (TADF) from a phenoxazine-triphenyltriazine (PXZ-TRZ) derivative", Chemical Communications, vol. 48, Issue 93, Dec. 2012, pp. 11392-11394.

Tanaka et al.,"Twisted Intramolecular Charge Transfer State for Long-Wavelength Thermally Activated Delayed Fluorescence", Chemistry of Materials, vol. 25, Issue 18, Sep. 2013, pp. 3766-3771.

Joyama et al., "Highly efficient organic light-emitting diodes from delayed fluorescence", Nature, vol. 492, 2012, pp. 234-238.

Zhang et al., "Design of efficient thermally activated delayed fluorescence materials for pure blue organic light emitting diodes", J Am Chem Soc, vol. 134, Issue 36, Sep. 2012, pp. 14706-14709.

Zhang et al., "Enhanced proportion of radiative excitons in non-doped electro-fluorescence generated from an imidazole derivative with an orthogonal donor-acceptor structure", Chemical Communications, vol. 49, No. 96, 2013, DOI: 10.1039/c3cc47130f, pp. 3.

Zhang et al., "Extremely low driving voltage electrophosphorescent green organic light-emitting diodes based on a host material with small singlet-triplet exchange energy without p- or n-doping layer", Organic Electronics, vol. 14, Issue 1, Jan. 2013, pp. 260-266.

Zhang et al., "Towards ideal electrophosphorescent devices with low dopant concentrations: the key role of triplet up-conversion", Journal of Materials Chemistry C, vol. 2, Issue 42, 2014, pp. 8983-8989.

CN Office Action dated Mar. 24, 2017 as received in Application No. 201410846786.9 (English Translation).

ORGANIC ELECTROLUMINESCENT DEVICE

TECHNICAL FIELD

The present invention relates to the field of organic electroluminescence device, and particularly to an organic electroluminescence device whose luminescent layer employs a novel host material.

BACKGROUND OF THE PRESENT INVENTION

Organic electroluminescence devices have drawn the broad attention of people due to the advantages such as thin bodies, large planar sizes, complete fixation and good flexibility, and organic white electroluminescence devices have become a research hotspot because of the great potential in solid state illumination light source and liquid crystal backlight light source.

As early as in 1950s, Bernanose. A et al began the research on organic electroluminescence devices (OLED). The initial research material was anthracene single crystal wafer. Because of the problem of the large thickness of the single crystal wafer, the required driving voltage was very high. In 1987, C. W. Tang and Vanslyke of Eastman Kodak Company of the USA reported the organic small molecule electroluminescence device of the structure of ITO/Diamine/Alq$_3$/Mg:Ag, whose brightness under the working voltage of 10 volts reached 1000 cd/m$^2$, and external quantum efficiency reached 1.0%. The research on electroluminescence raises the concern of scientists, and people see the possibility of the application of organic electroluminescence devices in displaying, which initiates the research and industrialization of organic electroluminescence devices. The organic luminescence material system comprises the fluorescence system and the phosphorescence luminescence system, of which the fluorescence system only utilizes the singlet state exciton energy, while the phosphorescence system can additionally utilize the triplet state exciton energy.

In traditional organic electroluminescence devices (OLED) that employ phosphorescent dyes as the luminescent layer, because the life of the triplet state excitons is longer than the life of the singlet state excitons, the transfer distance of the triplet state excitons is longer than the transfer distance of the singlet state excitons (NATURE, Vol 440, 13 Apr. 2006). The triplet state excitons entering the transport layer will cause energy loss. In general, in order to confine the triplet state excitons within the luminescent layer, it is required to design barrier layer structures on both sides of the luminescent layer (film. Phys. Rev. B 66, 14422-14428 (1999)). Additionally, barrier layers are provided in N-doped OLED electron transport layer structures, to prevent N dopants from entering the luminescent layer to result in exciton quenching, but the adding of the barrier layers will complicate the device structure.

The above methods of adding barrier layers between the phosphorescence luminescent layer and the transport layer restrict excitons entering the transport layer and block the migrating of N dopants to the luminescent layer to a certain extent, but result in the complication of the device structure.

SUMMARY OF THE INVENTION

In order to solve the above technical problems, the present invention employs a thermally activated delayed fluorescence material, whose difference between the triplet state energy level and the singlet state energy level ($\Delta E_{ST}$) is relatively small, wherein the $\Delta E_{ST}$<0.3 eV and preferably the $\Delta E_{ST}$<0.15 eV. The present invention employs the material as the phosphorescence host, so part of the triplet state exciton level transfers to the singlet state excitons, and the amount of the overall triplet state excitons reduces. Therefore, the concentration of the triplet state excitons decreases, and the luminescence recombination region becomes narrower, which effectively reduces the probability of excitons entering the charge transport layer, and at the same time the narrowing of the recombination region effective prevents the diffusion of N-type dopants into the exciton recombination region. Additionally, by employing the material as the phosphorescence host, the device corresponds to a low working voltage.

The organic electroluminescence device of the present invention comprises a luminescent layer, wherein, a host material of the luminescent layer comprises a thermally activated delayed fluorescence material, the host material is doped by a dye, and the dye comprises at least one phosphorescent dye.

Preferably, the dye is a phosphorescent dye, or, the dye is formed by combining two or more phosphorescent dyes, or, the dye is formed by combining a phosphorescent dye and a fluorescent dye.

Preferably, a doping mass percentage of the fluorescent dye in the luminescent layer is 1%-5%.

Preferably, a doping mass percentage of the phosphorescent dye in the luminescent layer is 1%-15%.

Preferably, a doping mass percentage of the phosphorescent dye in the luminescent layer is 10%.

Preferably, an energy gap between a triplet state energy level and a singlet state energy level of the thermally activated delayed fluorescence material is <0.3 eV, preferably <0.15 eV.

Preferably, a lumo energy level and a homo energy level of the thermally activated delayed fluorescence material distribute on different groups in its molecular structure.

Preferably, the thermally activated delayed fluorescence material is a material that has charge transfer transition, and the thermally activated delayed fluorescence material has both a donor group unit and an acceptor group unit therein, the donor group unit is a donor group or a group that is formed by linking two or more donor groups;

the acceptor group unit is an acceptor group or a group that is formed by linking two or more acceptor groups;

the donor group is selected from indolocarbazolyl, carbazolyl, bicarbazolyl, trianilino, phenoxazinyl, indolocarbazolyl that is substituted by one or more groups of $C_{1-6}$ alkyl, methoxy, ethoxy or phenyl, carbazolyl that is substituted by one or more groups of $C_{1-6}$ alkyl, methoxy, ethoxy or phenyl, bicarbazolyl that is substituted by one or more groups of $C_{1-6}$ alkyl, methoxy, ethoxy or phenyl, trianilino that is substituted by one or more groups of $C_{1-6}$ alkyl, methoxy, ethoxy or phenyl, or phenoxazinyl that is substituted by one or more groups of $C_{1-6}$ alkyl, methoxy, ethoxy or phenyl; and the acceptor group is selected from naphthyl, anthracenyl, phenanthrenyl, pyrenyl, triazinyl, benzimidazolyl, cyano, pyridinyl, sulfonyl, phenanthroimidazolyl, naphthathiazolyl, benzothiazolyl, oxadiazolyl, naphthyl that is substituted by one or more groups of $C_{1-6}$ alkyl, methoxy, ethoxy, phenyl or pyridinyl, anthracenyl that is substituted by one or more groups of $C_{1-6}$ alkyl, methoxy, ethoxy, phenyl or pyridinyl, phenanthrenyl that is substituted by one or more groups of $C_{1-6}$ alkyl, methoxy, ethoxy, phenyl or pyridinyl, pyrenyl that is substituted by one or more groups of $C_{1-6}$ alkyl, methoxy, ethoxy, phenyl or pyridinyl, triazinyl that is substituted by one or more groups of $C_{1-6}$ alkyl, methoxy, ethoxy, phenyl or pyridinyl, benzimidazolyl that is substituted by one or more groups of $C_{1-6}$ alkyl, methoxy, ethoxy, phenyl or pyridinyl, pyridinyl that is substituted by one or more groups of $C_{1-6}$ alkyl, methoxy, ethoxy, phenyl or pyridinyl, sulfonyl that is substituted by one or more groups of $C_{1-6}$ alkyl, methoxy, ethoxy, phenyl or pyridinyl, phenanthroimidazolyl that is substituted by one or more groups of $C_{1-6}$ alkyl, methoxy, ethoxy, phenyl or pyridinyl, naphthathiazolyl that is substituted by one or more groups of $C_{1-6}$ alkyl, methoxy, ethoxy, phenyl or pyridinyl, benzothiazolyl that is substituted by one or more groups of $C_{1-6}$ alkyl, methoxy, ethoxy, phenyl or pyridinyl, and oxadiazolyl that is substituted by one or more groups of $C_{1-6}$ alkyl, methoxy, ethoxy, phenyl or pyridinyl;

wherein, one or more of the donor group units and one or more of the acceptor group units directly link to form the host material; or, one or more of the donor group units and one or more of the acceptor group units individually link to a linking group to form the host material, wherein the linking group is a group that has a steric hindrance.

Preferably, one or two of the donor group units and one or two of the acceptor group units individually link to the linking group to form the thermally activated delayed fluorescence material, or one or two of the acceptor group units and one or two of the donor group units directly link to form the thermally activated delayed fluorescence material.

Preferably, the linking group is selected from spirofluorenyl, phenyl, biphenyl, spirofluorenyl that is substituted by at least one of $C_{1-6}$ alkyl or phenyl, phenyl that is substituted by at least one of $C_{1-6}$ alkyl or phenyl, biphenyl that is substituted by at least one of $C_{1-6}$ alkyl or phenyl.

Preferably, the donor group is selected from the following groups:

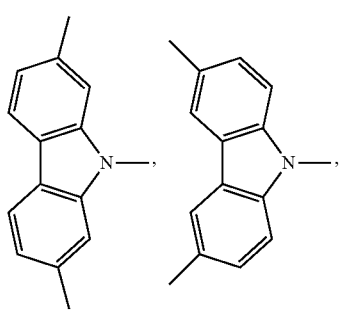

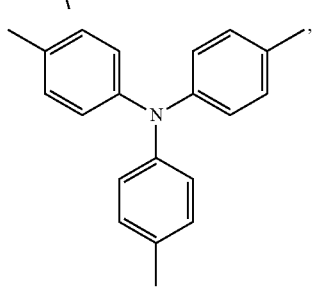

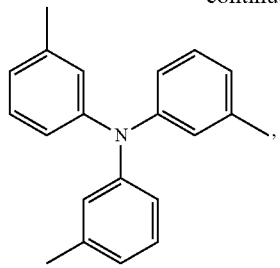

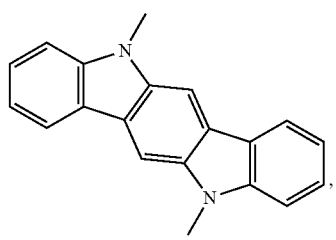

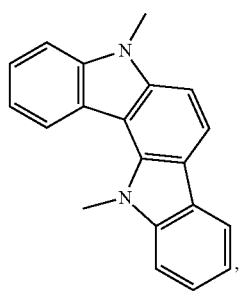

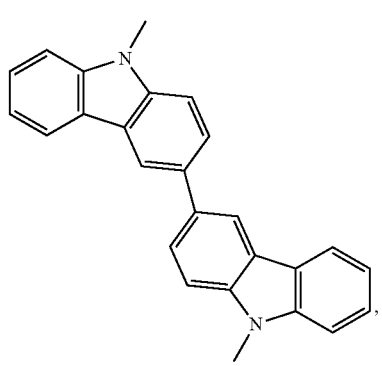

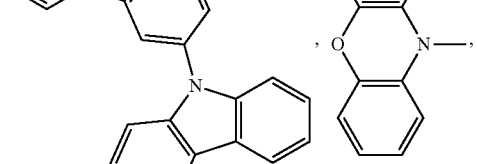

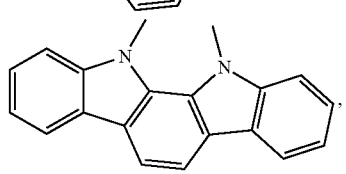

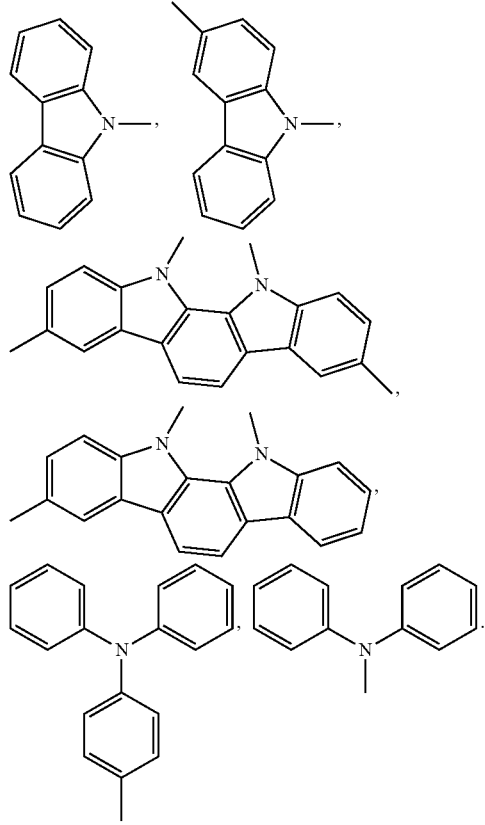
Preferably, the acceptor group is selected from the following groups:
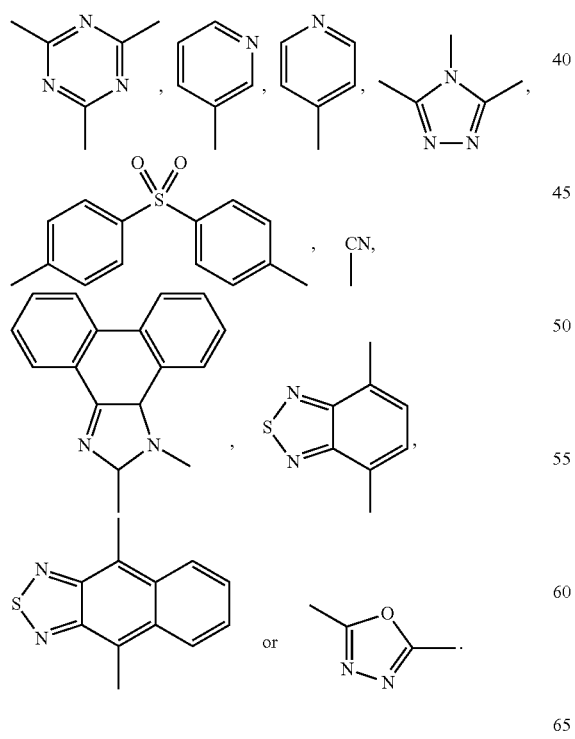
Preferably, the thermally activated delayed fluorescence material has the following structures:
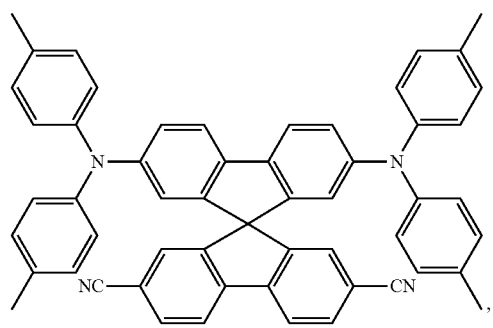
1-1
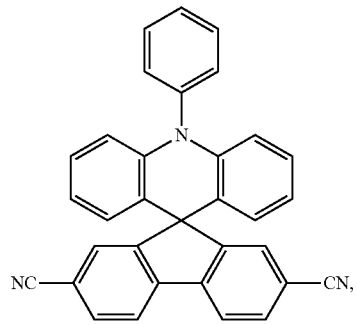
1-2
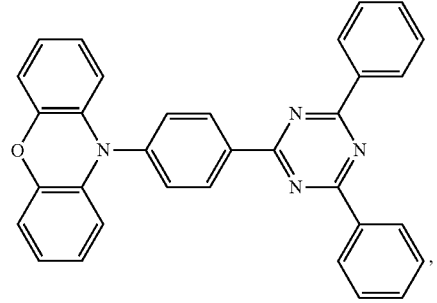
1-3
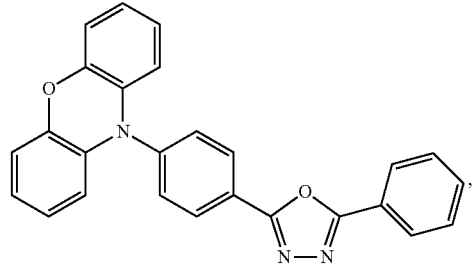
1-4
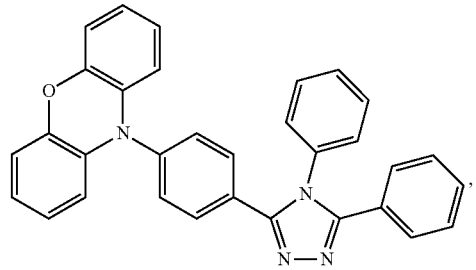
1-5

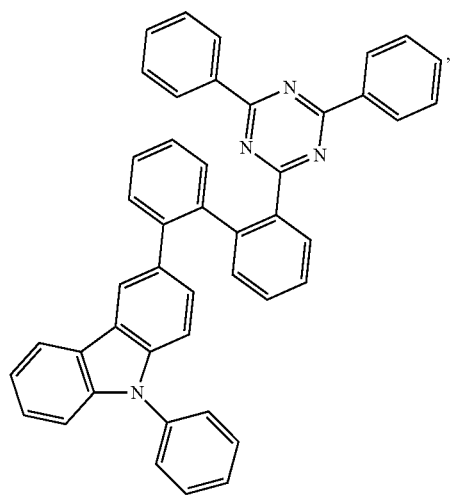
1-6
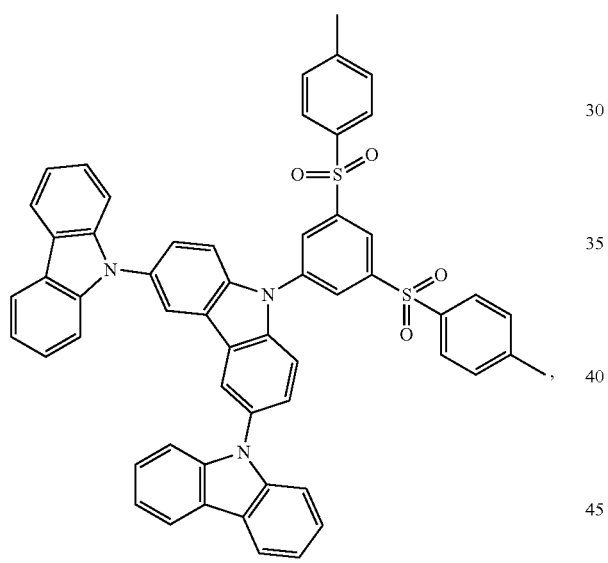
1-7
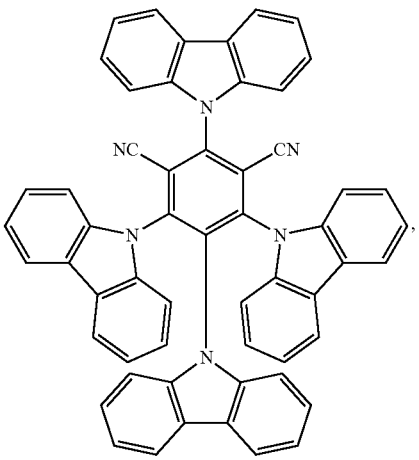
1-8
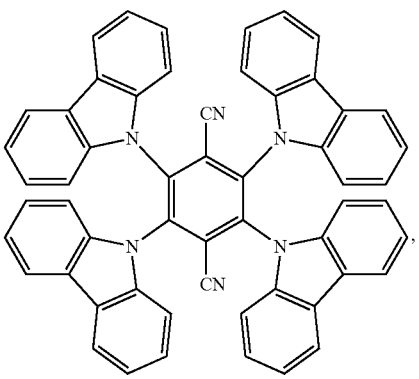
1-9
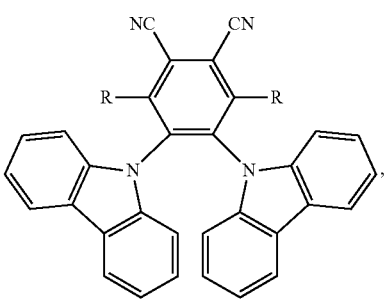
1-10
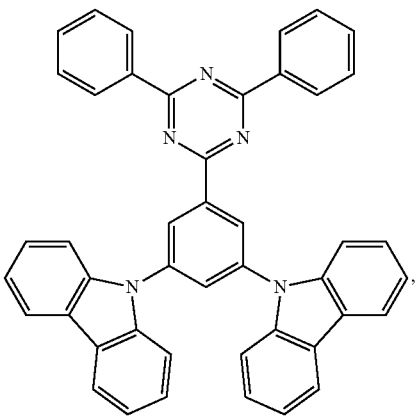
1-11
1-12

2-1
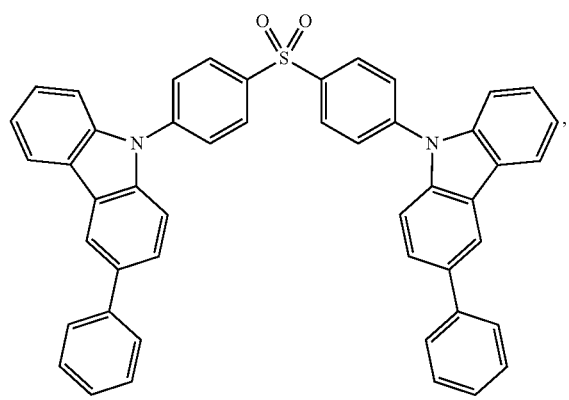
2-2
2-3
2-4
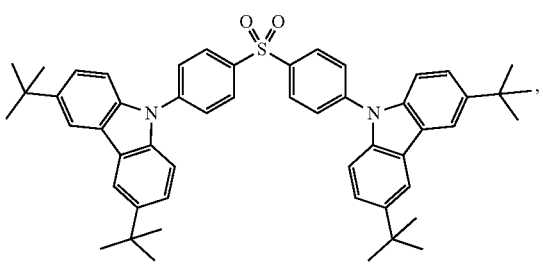 2-5
2-6
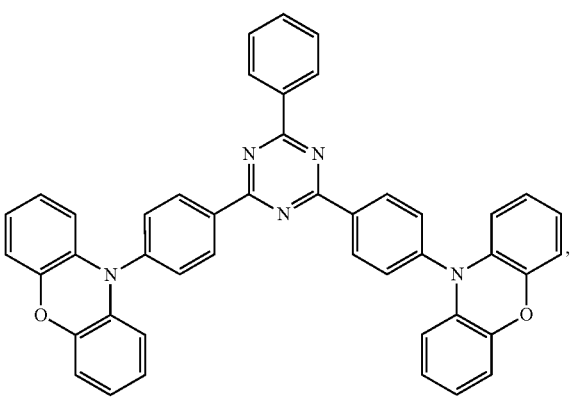
2-7
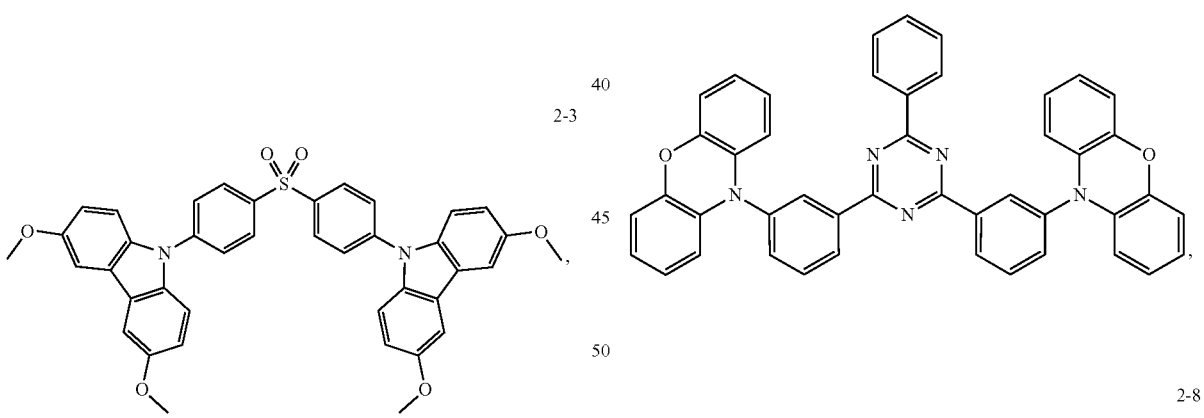
2-8
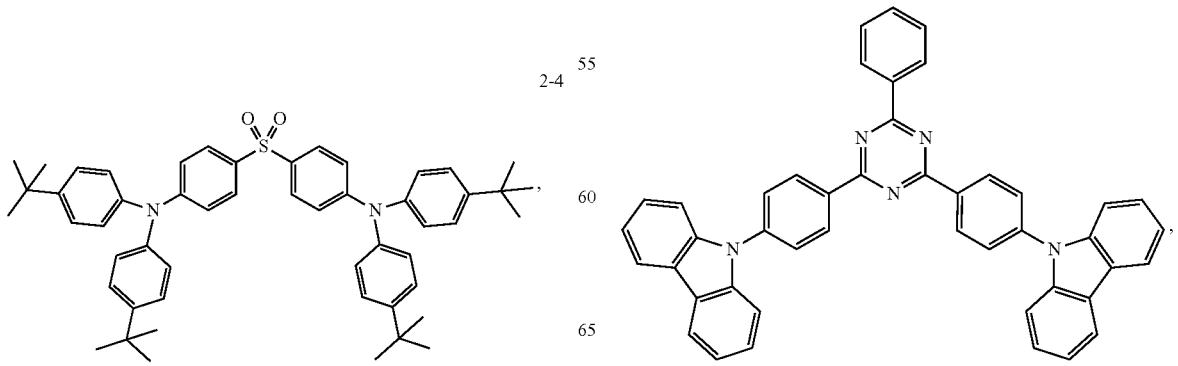

2-9
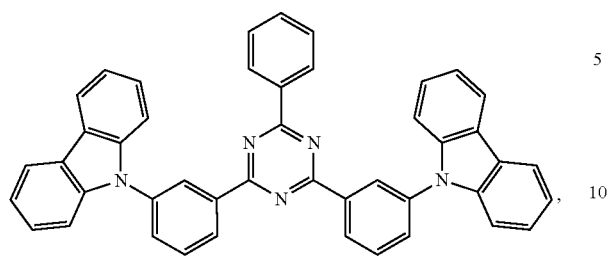
2-10
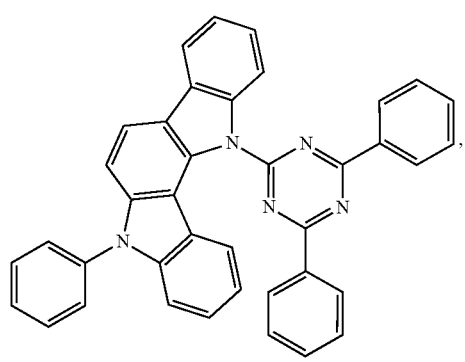
2-11
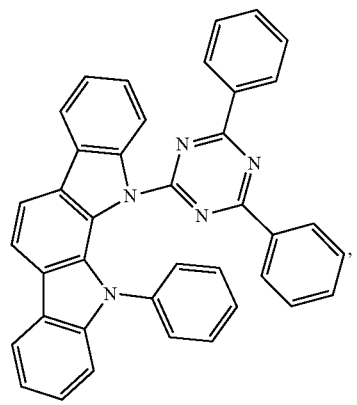
2-12
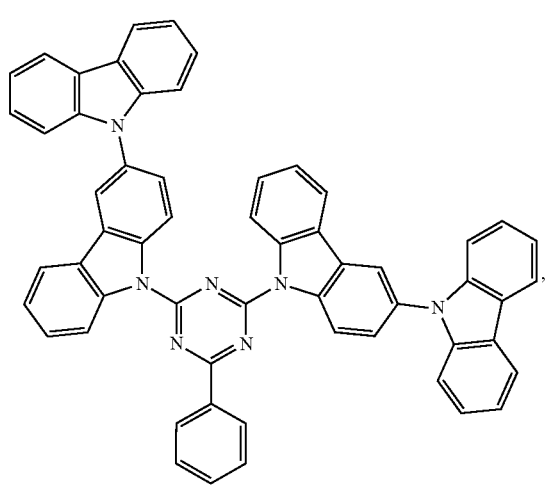
2-13
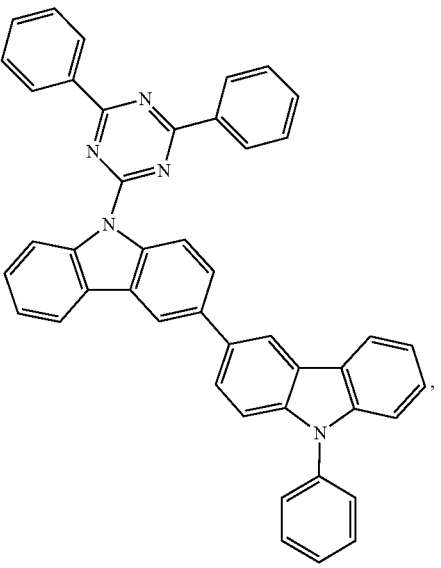
2-14
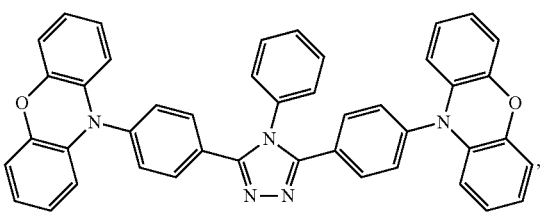
2-15
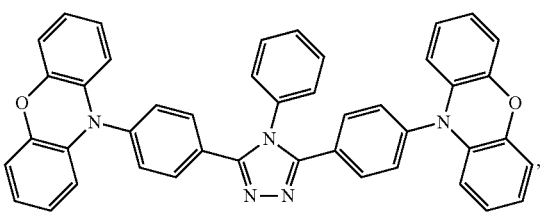
3-1
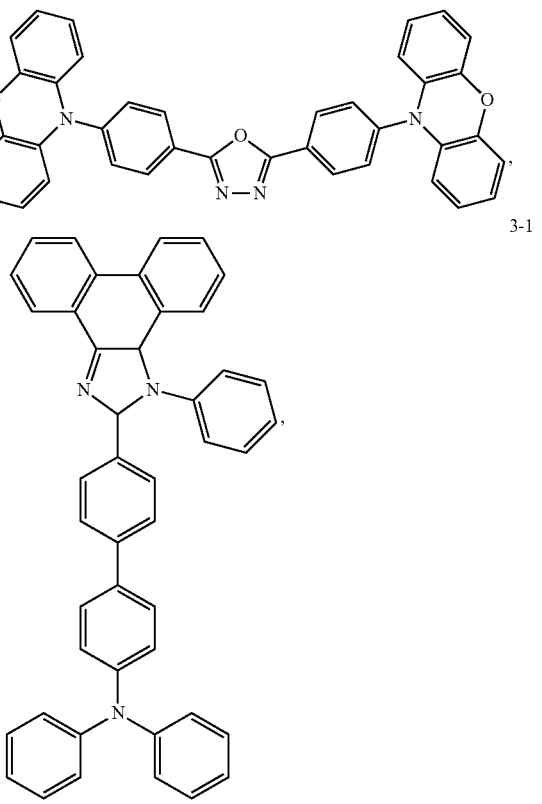

-continued
3-2
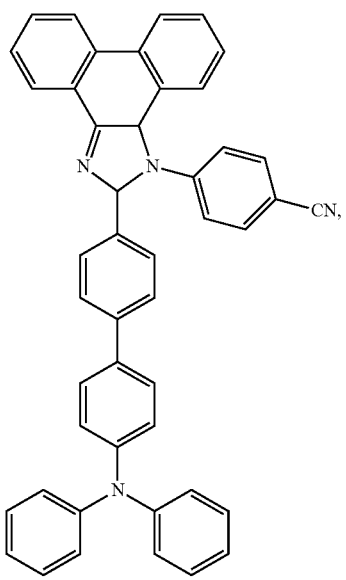
3-5
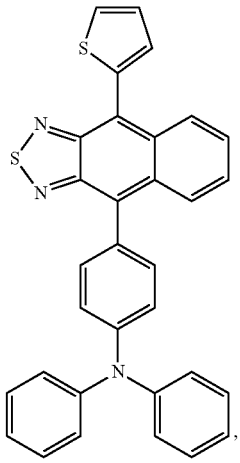
3-3
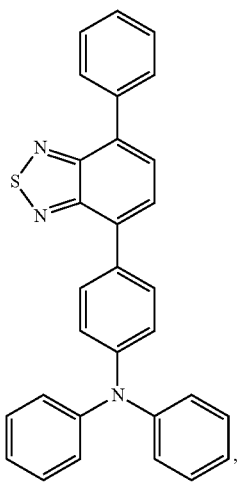
3-6
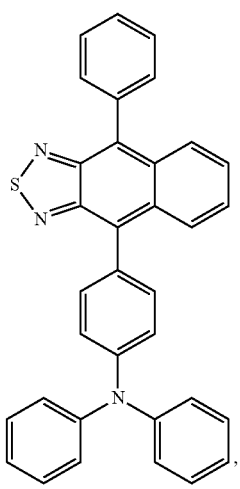
3-4
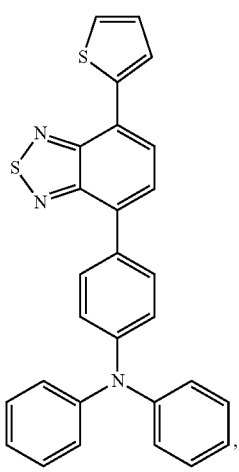
3-7
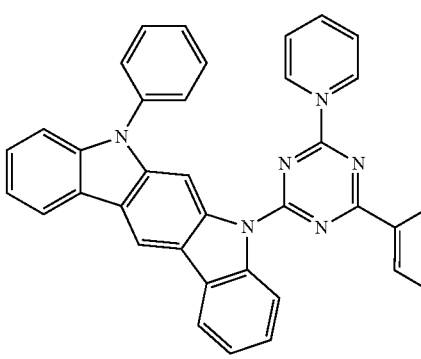
3-8
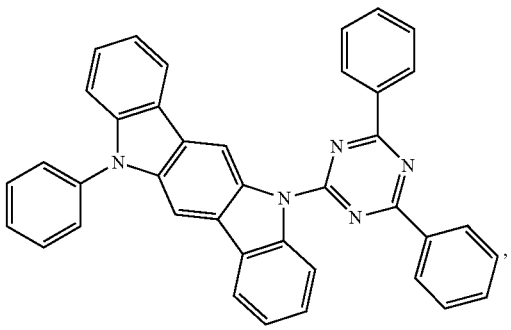

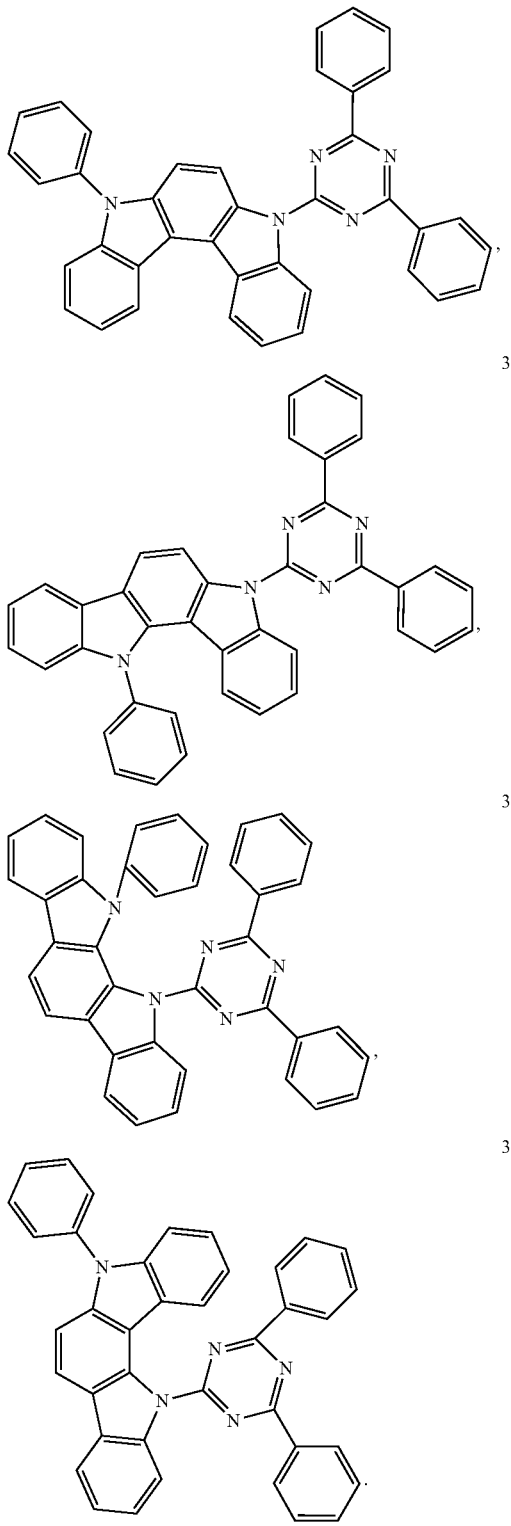

The organic electroluminescence device of the present invention is formed by successively laminating and depositing an anode, a hole injection layer, a hole transport layer, the luminescent layer, an electron transport layer and a cathode on a substrate; or, the organic electroluminescence device is formed by successively laminating and depositing an cathode, an electron transport layer, the luminescent layer, a hole transport layer, a hole injection layer and an anode on a substrate.

The present invention can achieve the following technical effects:

1. The phosphorescence host material of the luminescent layer of the organic electroluminescence device of the present invention employs the thermally activated delayed fluorescence material (TADF material), whose difference between the triplet state energy level and the singlet state energy level is relatively small, (wherein the $\Delta E_{ST}<0.3$ eV and preferably the $\Delta E_{ST}<0.15$ eV). Therefore, in the process of the energy transfer from the host to the dye, part of the triplet state energy of the TADF material can be converted into singlet state energy, so the amount of the overall triplet state excitons is smaller. As a result, the recombination region of the excitons becomes narrower. Therefore, excitons will not enter the transport layer, and additionally N-type dopants will not diffuse to the exciton recombination region.

2. Because the luminescent layer of the organic electroluminescence device of the present invention employs the TADF material as the phosphorescence host material, the migration radius of the excitons is reduced, and the exciton barrier layer can be eliminated, which simplifies the structure and the preparation process of the device.

3. Conventional phosphorescence host materials require high triplet state energy levels, and at the same time the triplet state energy level and the singlet state energy level are high. Therefore, the singlet state energy levels are very high, and the energy gap of the material is highly large, so employing the materials as the host results in higher driving voltages of the devices. However, if the TADF material is employed as the phosphorescence host, its triplet state energy level and singlet state energy level are close, and the energy gap of the material is narrow, which can effectively reduce the working voltages of the devices.

EMBODIMENTS OF THE PRESENT INVENTION

Figure 1:
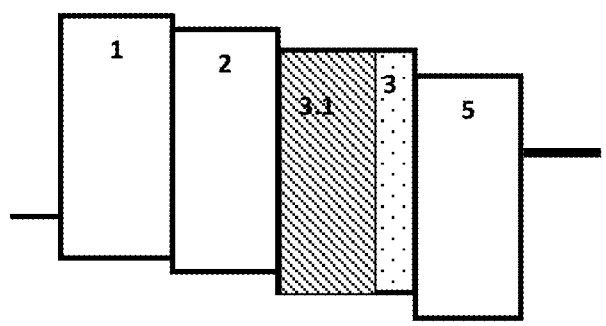
FIG. 1 is the structural representation of the OLED of Example 1 of the present invention.

The present invention will be further illustrated below by referring to the drawings and the special examples, to enable a person skilled in the art to better understand and implement the present invention, but the examples are not taken as limiting the present invention.

As shown in FIG. 1, the structure of the organic electroluminescence device in the following embodiment of the present invention is as follows: an anode (not shown in the figure), a hole injection layer 1, a hole transport layer 2, a luminescent layer 3, an electron transport layer 5 and a cathode (not shown in the figure) that are successively laminated and deposited on a substrate (not shown in the figure). In that, the luminescent layer 3 employs the thermally activated delayed fluorescence material as the host material, which is doped by a dye, and the dye comprises at least one phosphorescent dye.

Figure 2:
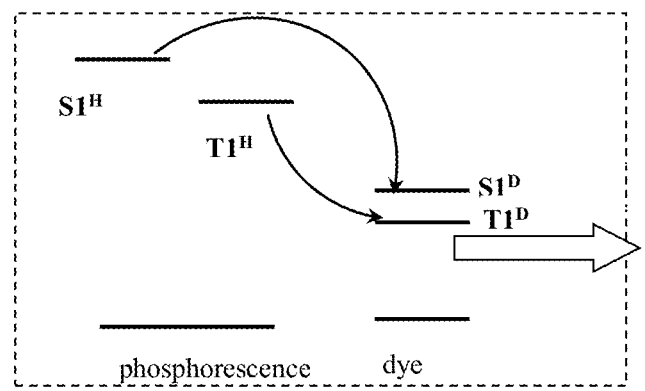
FIG. 2 is the schematic diagram of the process of the energy transfer of the conventional phosphorescence host doped by a phosphorescent dye in the prior art.
Figure 3:
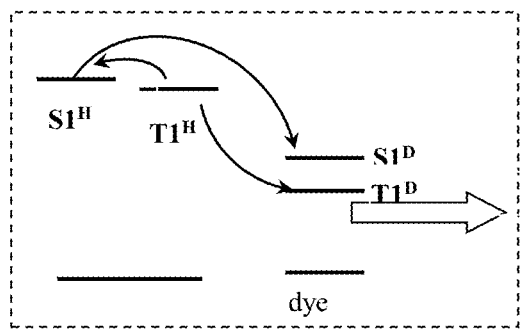
FIG. 3 is the schematic diagram of the process of the energy transfer of the TADF material of the present invention, as the phosphorescence host material, doped by a phosphorescent dye.

Referring to FIGS. 2 and 3, the process of the energy transfer in the luminescent layer of the present invention is illustrated.

As shown in FIG. 2, the luminescent layer of the prior art is a conventional phosphorescence host material doped by a phosphorescent dye. The difference between the triplet state energy level and the singlet state energy level of the conventional phosphorescence host material is relatively large, and its process of the energy transfer is as follows: the energy of the singlet state energy level of the host material ($S1^H$) is transferred to the singlet state energy level of the phosphorescent dye ($S1^D$), and the energy of the triplet state energy level of the host material ($T1^H$) is transferred to the triplet state energy level of the phosphorescent dye ($T1^D$). Because the life of the triplet state excitons is longer than the life of the singlet state excitons, the transfer distance of the triplet state excitons is longer than the transfer distance of the singlet state excitons. The triplet state entering the transport layer of the OLED will cause energy loss.

Figure 6:
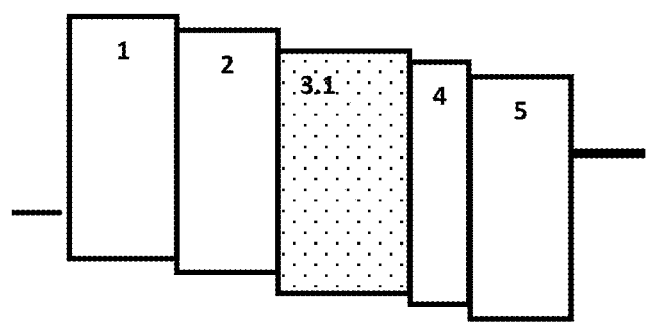
FIG. 6 is the structural representation of the OLED of Comparative Example 3.

The difference between the triplet state energy level and the singlet state energy level of the thermally activated delayed fluorescence material (TADF material) as the host material is relatively small (wherein the $\Delta E_{ST}$<0.3 eV and preferably the $\Delta E_{ST}$<0.15 eV). As shown in FIG. 3, in the luminescent layer where the TADF material serves as the host and is doped by a phosphorescent dye, in the process of the energy transfer from the host material to the dye, part of the triplet state energy level of the TADF material ($T1^H$) is converted to the singlet state energy level ($S1^H$), and then the energy of the singlet state energy level of the host is transferred to the singlet state energy level of the dye ($S1^D$) and the energy of the triplet state energy level of the host is transferred to the triplet state energy level of the dye ($T1^D$). In such a way, the amount of the overall triplet state excitons is smaller, so that the recombination region of the excitons becomes narrower (as shown in FIG. 1, only part of the luminescent layer 3 is the exciton recombination region 3.1, while, as shown in FIG. 6, in the structure of the prior art the whole of the luminescent layer 3 is the exciton recombination region 3.1). Therefore, excitons will not enter the transport layer, and additionally N-type dopants will not diffuse to the exciton recombination region of the luminescent layer 3.

By employing the TADF material as the phosphorescence host material, the migration radius of the excitons is reduced. The phosphorescence host materials in the prior art, especially blue and green phosphorescence hosts, require high triplet state energy levels, and at the same time the triplet state energy level and the singlet state energy level are high. Therefore, the singlet state energy levels are very high. The problem when that type of wide energy gap materials serve as the luminescence host is high driving voltage. However, if the TADF material is employed as the phosphorescence host, which can effectively reduce the working voltages of the devices.

The energy gap between the singlet state and the triplet state of the thermally activated delayed fluorescence material of the present invention ($\Delta E_{ST}$) is <0.3 eV, and preferably less than 0.15 eV.

Particularly, the thermally activated delayed fluorescence material that serves as the host material in the present invention is the following materials:

The materials that have small energy gaps between the triplet state and the singlet state require the separation of the HOMO orbit and the LOMO orbit of the corresponding molecules. Such materials generally contain a donor group unit and an acceptor group unit.

The thermally activated delayed fluorescence material in the present invention is a material that has charge transfer transition, and the thermally activated delayed fluorescence material has both a donor group unit and an acceptor group unit therein, wherein, the donor group unit is a donor group or a group that is formed by linking two or more donor groups; the acceptor group unit is an acceptor group or a group that is formed by linking two or more acceptor groups.

Specially, the structure of the host material may be donor-connection-acceptor, donor-acceptor-donor, and so on.

the donor group is selected from indolocarbazolyl, carbazolyl, bicarbazolyl, trianilino, phenoxazinyl, indolocarbazolyl that is substituted by one or more groups of $C_{1-6}$ alkyl, methoxy, ethoxy or phenyl, carbazolyl that is substituted by one or more groups of $C_{1-6}$ alkyl, methoxy, ethoxy or phenyl, dibenzofuranyl that is substituted by one or more groups of $C_{1-6}$ alkyl, methoxy, ethoxy or phenyl, trianilino that is substituted by one or more groups of $C_{1-6}$ alkyl, methoxy, ethoxy or phenyl, or phenoxazinyl that is substituted by one or more groups of $C_{1-6}$ alkyl, methoxy, ethoxy or phenyl; and the acceptor group is selected from naphthyl, anthracenyl, phenanthrenyl, pyrenyl, triazinyl, benzimidazolyl, cyano, pyridinyl, sulfonyl, phenanthroimidazolyl, naphthathiazolyl, benzothiazolyl, oxadiazolyl, naphthyl that is substituted by one or more groups of $C_{1-6}$ alkyl, methoxy, ethoxy, phenyl or pyridinyl, anthracenyl that is substituted by one or more groups of $C_{1-6}$ alkyl, methoxy, ethoxy, phenyl or pyridinyl, phenanthrenyl that is substituted by one or more groups of $C_{1-6}$ alkyl, methoxy, ethoxy, phenyl or pyridinyl, pyrenyl that is substituted by one or more groups of $C_{1-6}$ alkyl, methoxy, ethoxy, phenyl or pyridinyl, triazinyl that is substituted by one or more groups of $C_{1-6}$ alkyl, methoxy, ethoxy, phenyl or pyridinyl, benzimidazolyl that is substituted by one or more groups of $C_{1-6}$ alkyl, methoxy, ethoxy, phenyl or pyridinyl, pyridinyl that is substituted by one or more groups of $C_{1-6}$ alkyl, methoxy, ethoxy, phenyl or pyridinyl, sulfonyl that is substituted by one or more groups of $C_{1-6}$ alkyl, methoxy, ethoxy, phenyl or pyridinyl, phenanthroimidazolyl that is substituted by one or more groups of $C_{1-6}$ alkyl, methoxy, ethoxy, phenyl or pyridinyl, naphthathiazolyl that is substituted by one or more groups of $C_{1-6}$ alkyl, methoxy, ethoxy, phenyl or pyridinyl, benzothiazolyl that is substituted by one or more groups of $C_{1-6}$ alkyl, methoxy, ethoxy, phenyl or pyridinyl or oxadiazolyl that is substituted by one or more groups of $C_{1-6}$ alkyl, methoxy, ethoxy, phenyl or pyridinyl;

wherein, one or more of the donor group units and one or more of the acceptor group units directly link to form the thermally activated delayed fluorescence material; or, one or more of the donor group units and one or more of the acceptor group units individually link to a linking group to form the thermally activated delayed fluorescence material, wherein the linking group is a group that has a steric hindrance.

The linking group is preferably selected from spirofluorenyl, phenyl, biphenyl, spirofluorenyl that is substituted by at least one of $C_{1-6}$ alkyl or phenyl, phenyl that is substituted by at least one of $C_{1-6}$ alkyl or phenyl or biphenyl that is substituted by at least one of $C_{1-6}$ alkyl or phenyl.
The donor group is preferably selected from the following structures:
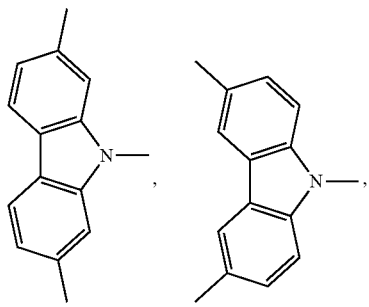
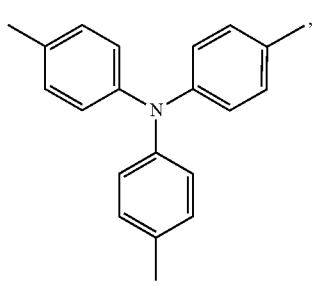
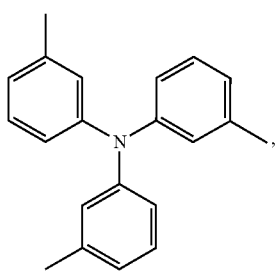
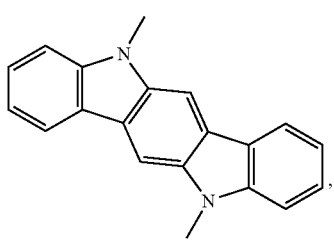
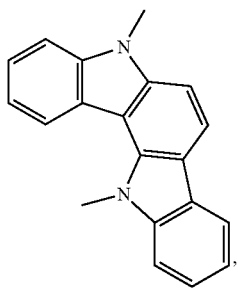
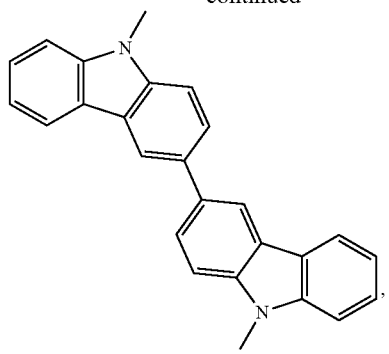
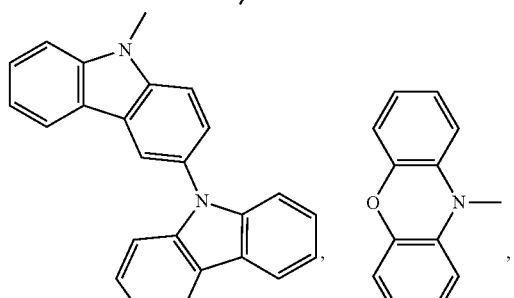
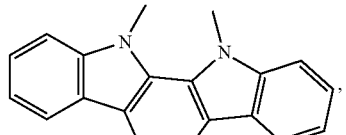
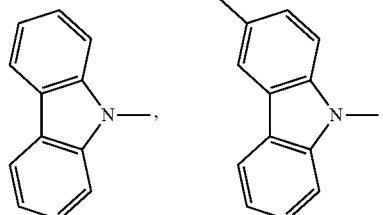
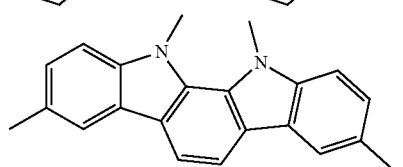
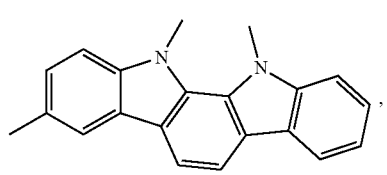
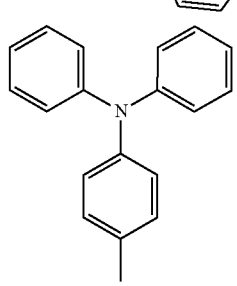 or 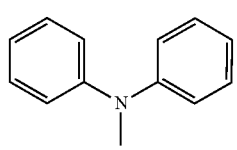.
The acceptor group is preferably selected from the following structures:

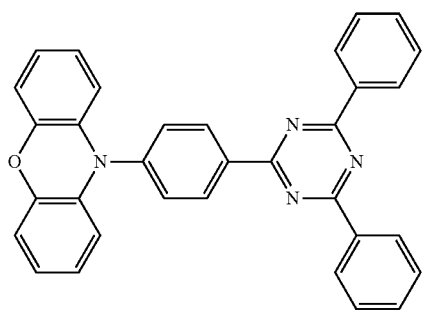
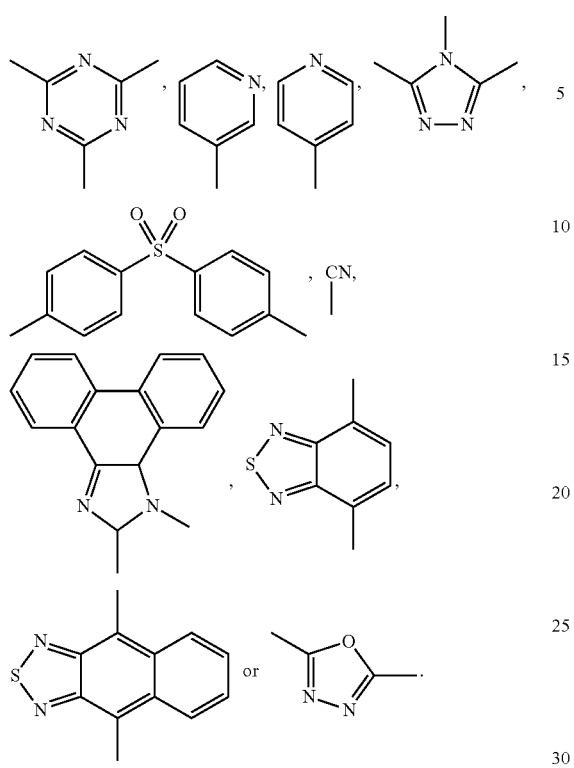
Particularly, the thermally activated delayed fluorescence material is selected from the compounds having the following structures:
1-1
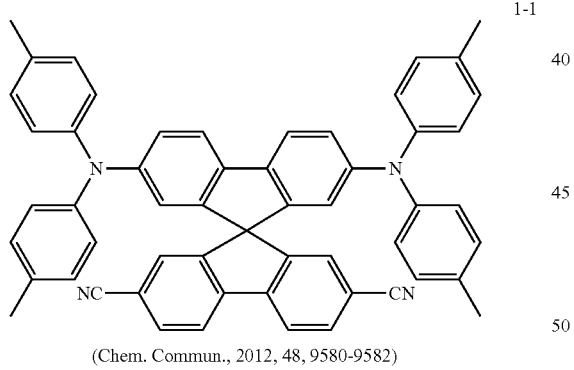
(Chem. Commun., 2012, 48, 9580-9582)
1-2
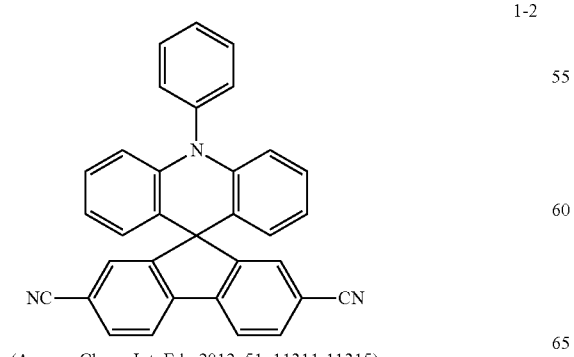
(Angew. Chem. Int. Ed., 2012, 51, 11311-11315)
1-3
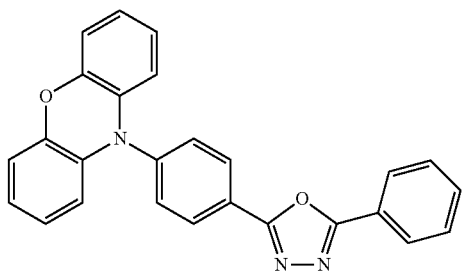
(Chem. Commun. 2012, 48, 11392-11394)
1-4
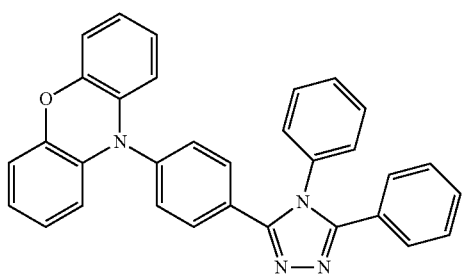
(J. Mater. Chem. C, 2013, 1, 4599-4604)
1-5
(J. Mater. Chem. C, 2013, 1, 4599-4604)
1-6
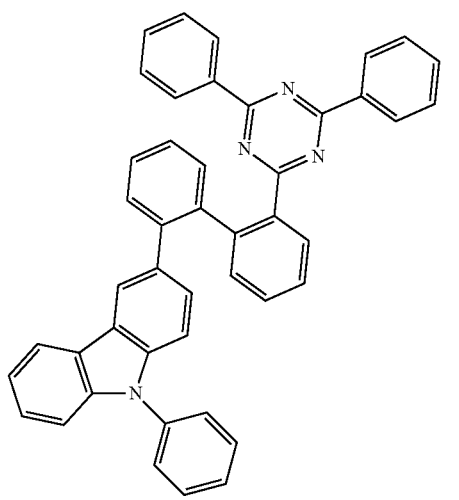
(Phys. Chem. Chem. Phys., 2013, 15, 15850)

1-7
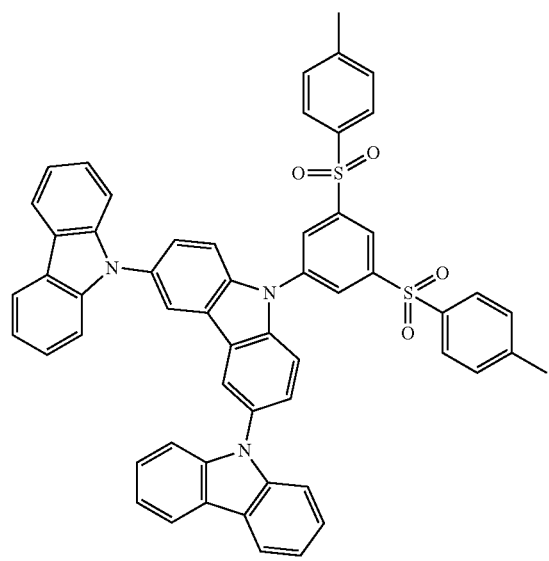
($\Delta E_{ST}$=0.11, calculated by using Gaussian 03/TD-DFT)
1-8
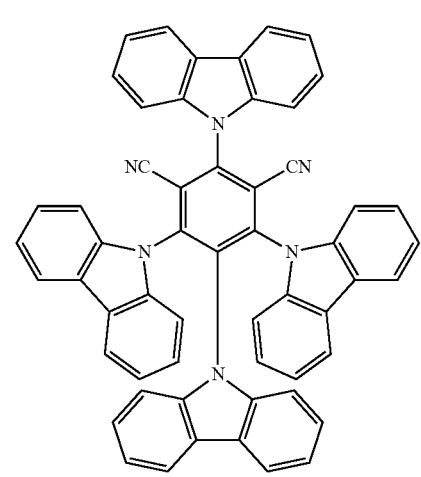
($\Delta E_{ST}$=0.14, calculated by using Gaussian 03/TD-DFT)
1-9
(Nature, 2012, 492, 234)
1-10
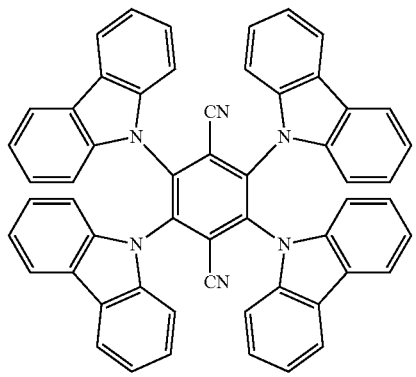
(Nature, 2012, 492, 234)
1-11
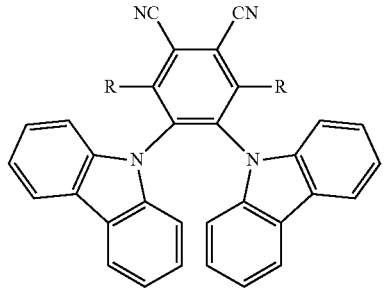
(Nature, 2012, 492, 234)
1-12
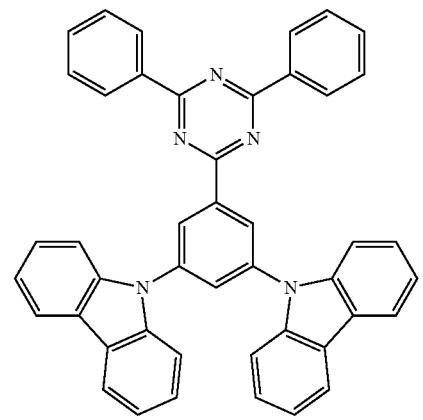
($\Delta E_{ST}$=0.21, calculated by using Gaussian 03/TD-DFT)
2-1
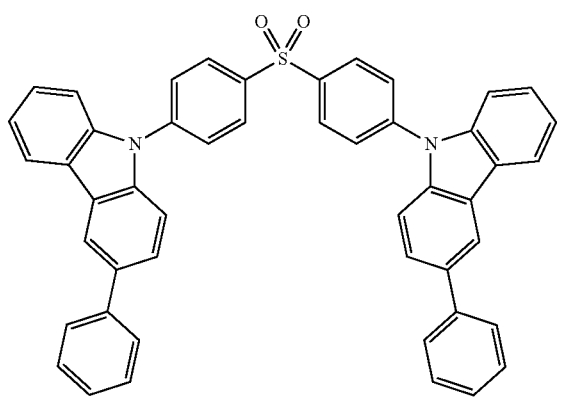
($\Delta E_{ST}$=0.15, calculated by using Gaussian 03/TD-DFT)

2-2
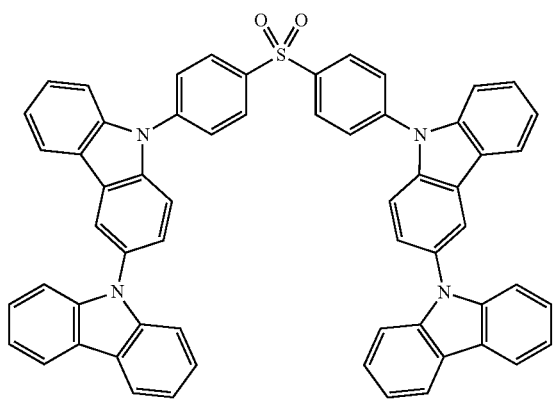
($\Delta E_{ST}$=0.04, calculated by using Gaussian 03/TD-DFT)
2-3
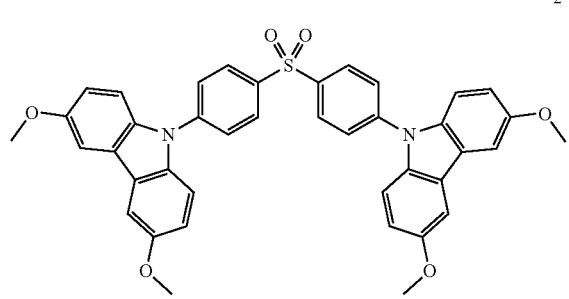
2-4
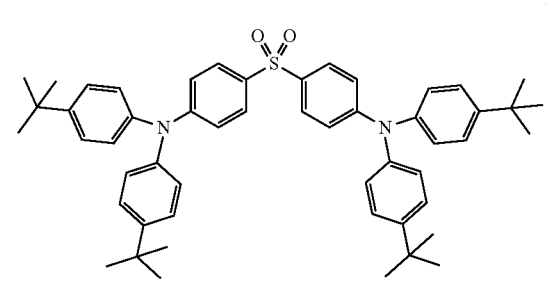
(J. AM. Chem. Soc. 2012, 134, 14706-14709)
2-5
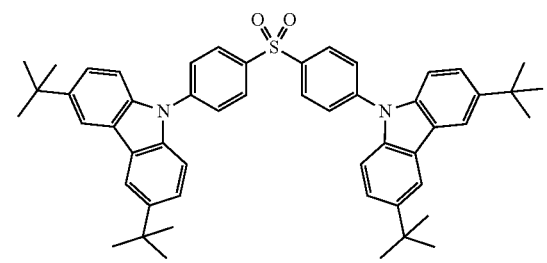
(J. AM. Chem. Soc. 2012, 134, 14706-14709)
2-6
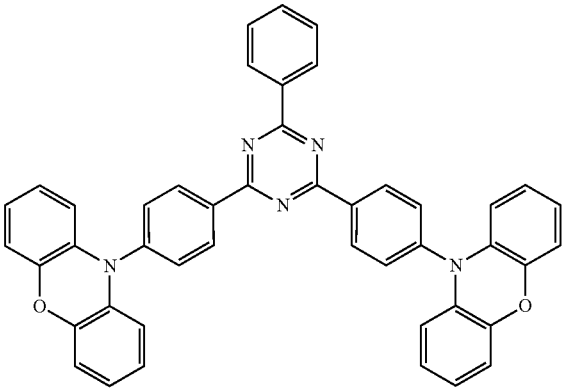
(Chem. Mater., 2013, 25 (18), pp 3766-3771)
2-7
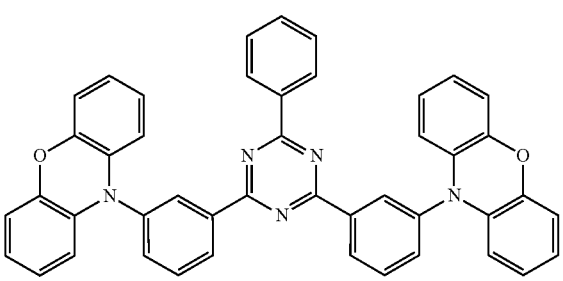
($\Delta E_{ST}$=0.07, calculated by using Gaussian 03/TD-DFT)
2-8
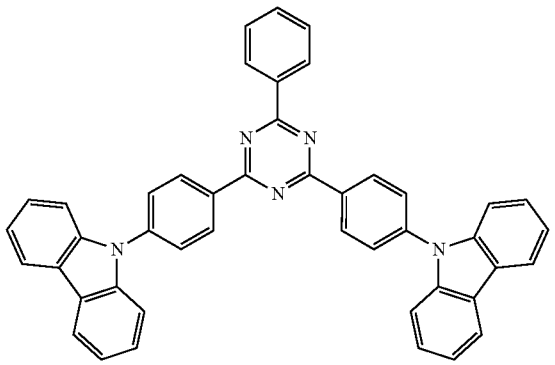
($\Delta E_{ST}$=0.16, calculated by using Gaussian 03/TD-DFT)
2-9
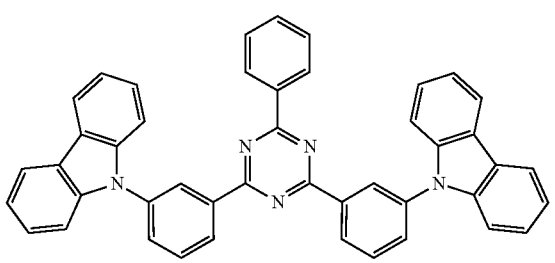
($\Delta E_{ST}$=0.09, calculated by using Gaussian 03/TD-DFT)

2-10
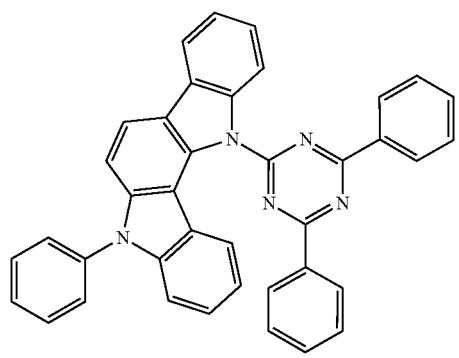
(PRL, 2013, 110, 247401)
2-11
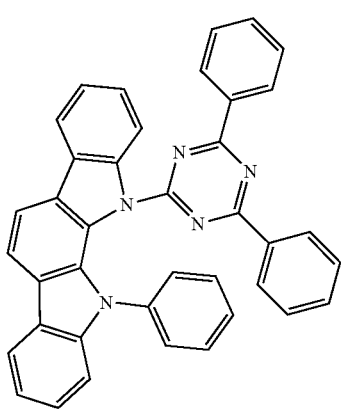
($\Delta E_{ST}$=0.06, calculated by using Gaussian 03/TD-DFT)
2-12
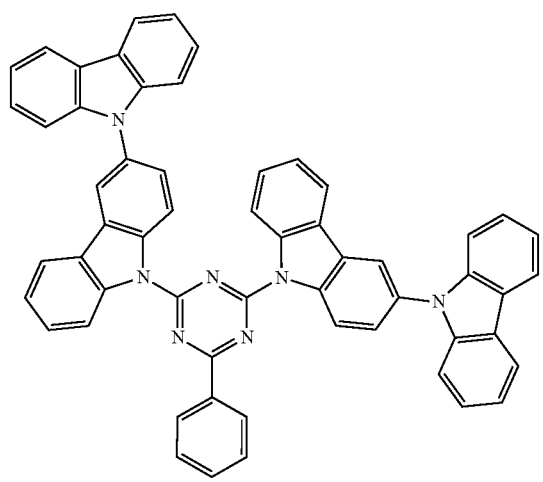
(Appl. Phys. Lett., 2012, 101, 093306)
2-13
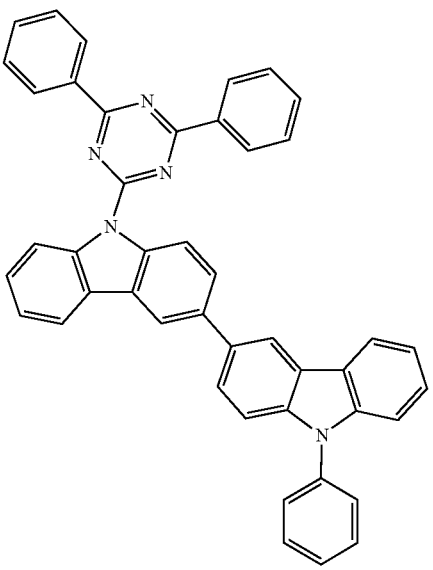
(Phys. Chem. Chem. Phys. 2013, 15, 15850)
2-14
(J. Mater. Chem. C, 2013, 1, 4599-4604)
2-15
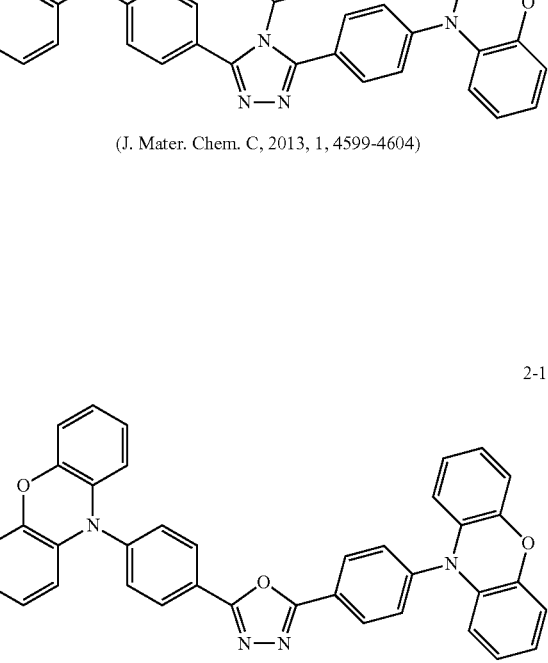
(J. Mater. Chem. C, 2013, 1, 4599-4604)

3-1

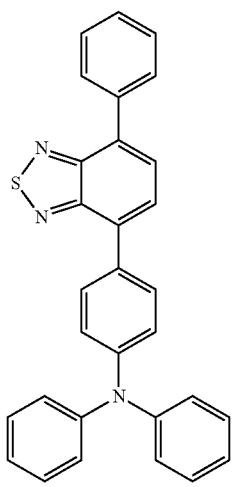

(The ΔE$_{ST}$ of the CT state = 0.03, and the energy level difference between the singlet state and the triplet state of the localized state is 1.1eV, calculated by using Gaussian 03/TD-DFT)

3-3

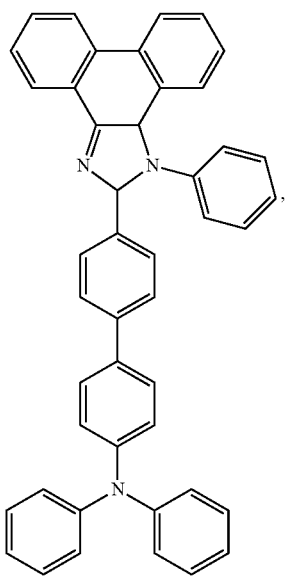

(CC, DOI: 10.1039/c3cc47130f)

3-2

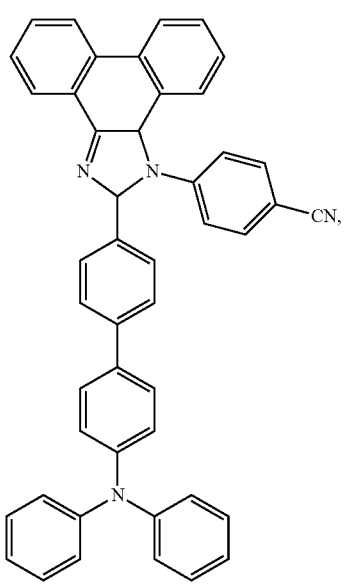

(CC, DOI: 10.1039/c3cc47130f)

3-4

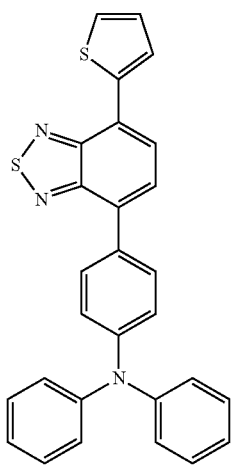

(The ΔE$_{ST}$ of the CT state = 0.05, and the energy level difference between the singlet state and the triplet state of the localized state is 1.2eV, calculated by using Gaussian 03/TD-DFT)

3-5
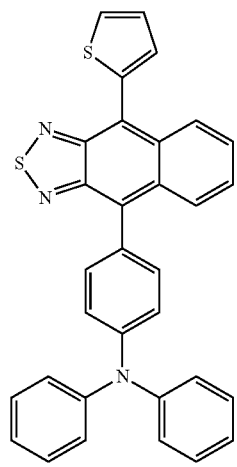
(The ΔE$_{ST}$ of the CT state = 0.01, and the energy level difference between the singlet state and the triplet state of the localized state is 1.4eV, calculated by using Gaussian 03/TD-DFT)
3-6
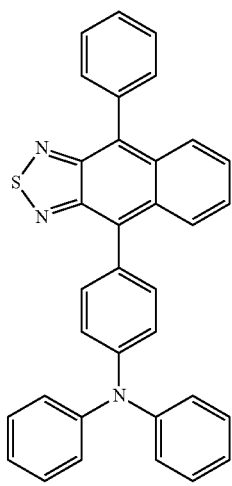
(AFM, DOI: 10.1002/adfm.201301750)
3-7
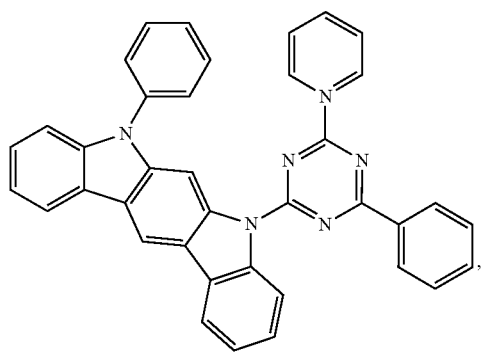
3-8
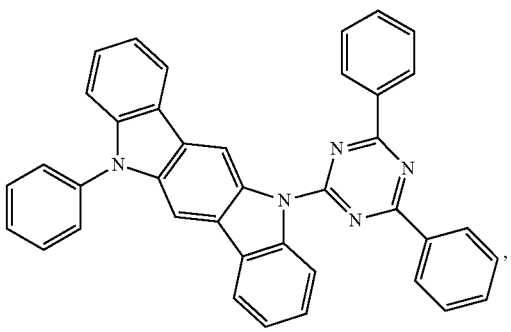
3-9
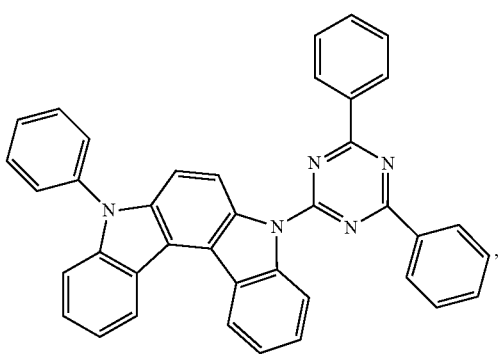
3-10
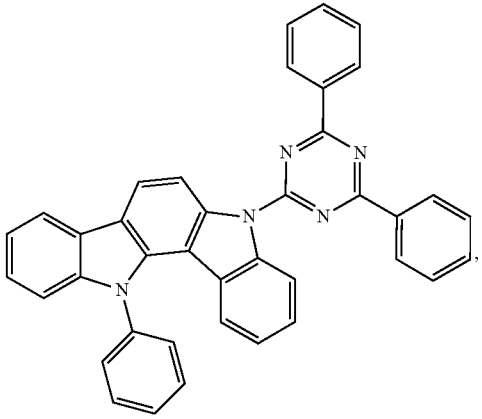
3-11
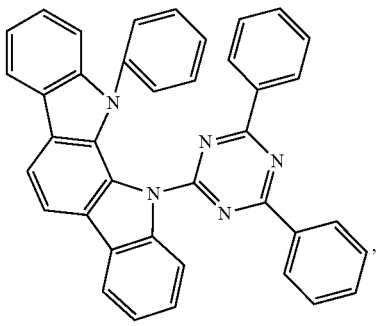

3-12

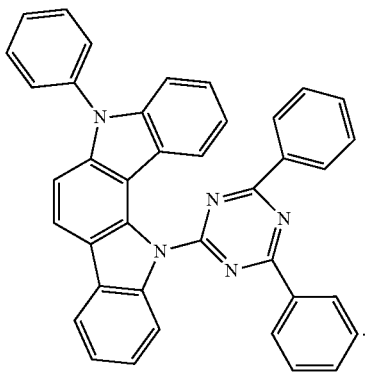

The syntheses of the relative compounds in the present application:
1. The Synthesis of the Compound 1-7

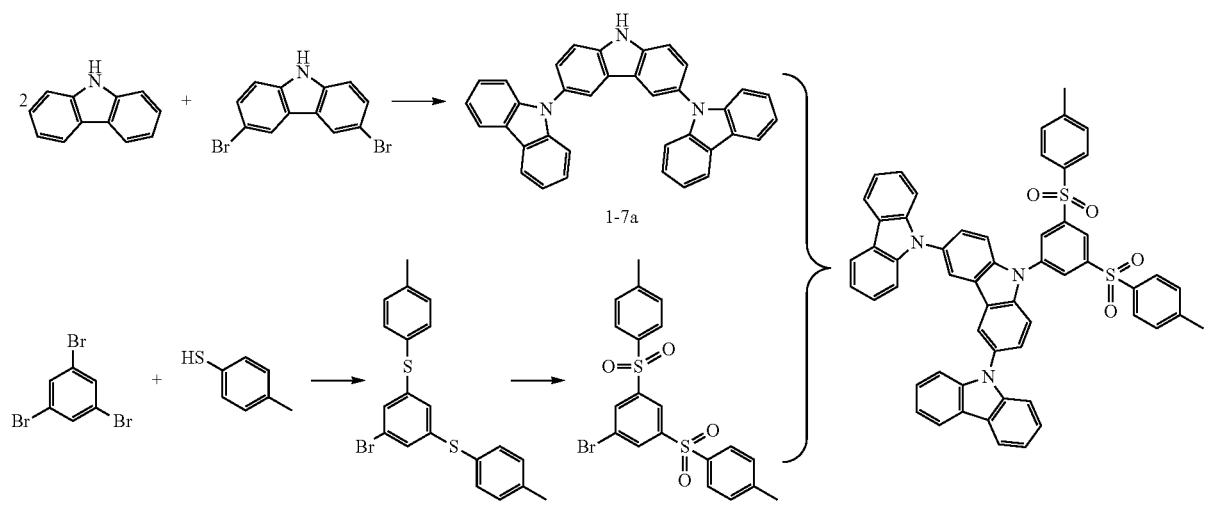

Synthesis 1-7a,
3.34 g of carbazole, 3.22 g of 3,6-dibromocarbazole, 0.5 g of CuI, 0.5 g phenanthroline and 5.2 g of potassium carbonate are added into a 100 ml round bottom flask, and 60 ml of DMF is added. The reaction is performed under a nitrogen atmosphere by heating to reflux for 48 hours. Subsequently the reaction liquid is poured into water, and is subject to vacuum filtration under reduced pressure to obtain a solid. The solid is separated by using a chromatographic column to obtain the 1-7a, with a yield of 30%.
Mass spectrometry data: ESI-MS m/z: 498 [M$^+$H]$^+$, elementary analysis: $C_{36}H_{23}N_3$: C: 86.90, H: 4.66, N: 8.44.

Synthesis 1-7b,
3.11 g of tribromobenzene, 2.48 g of p-methylbenzenethiol, 6 g of potassium carbonate, and 1 g of copper iodide are added into a 100 ml round bottom flask, and 50 ml of DMF is added. The mixture is heated at 100° C. under a nitrogen atmosphere for 24 hours. Subsequently the reaction liquid is poured into water, and is subject to vacuum filtration under reduced pressure to obtain a solid. The solid is separated by using a chromatographic column to obtain the 1-7b, with a yield of 60%.
Mass spectrometry data: ESI-MS m/z: 401 [M$^+$H]$^+$, elementary analysis: $C_{20}H_{17}BrS$, C: 59.85, H: 4.27.

Synthesis 1-7 c,
In an ice water bath, 30 ml of the 1-7b is slowly dropped into a dichloromethane solution in 1 g of mCPBA, the mixture is maintained in the ice water bath till the addition ends, and subsequently the reaction is performed for 12 h. The solid is separated by using a chromatographic column to obtain the 1-7c, with a yield of 99%.
Mass spectrometry data: ESI-MS m/z: 465 [M$^+$H]$^+$, elementary analysis: $C_{20}H_{17}BrO_4S_2$, C: 86.90, H: 4.66, N: 8.44.

Synthesis 1-7,
4.97 g of 1-7a, 4.63 g of 1-7b, 0.5 g of CuI, 0.5 g of phenanthroline and 5.2 g of potassium carbonate are added into a 100 ml round bottom flask, and 60 ml of DMF is added. The reaction is performed under a nitrogen atmosphere by heating to reflux for 48 hours. Subsequently the reaction liquid is poured into water, and is subject to vacuum filtration under reduced pressure to obtain a solid. The solid is separated by using a chromatographic column to obtain the 1-7, with a yield of 60%.
Mass spectrometry data: ESI-MS m/z: 882 [M$^+$H]$^+$, elementary analysis: $C_{56}H_{39}N_3O_4S_2$, C 76.25, H 4.46, N 4.76.

2. The Synthesis of the Compound 1-4
The synthesis of the 1-4 can refer to that of the 1-7. Substance detection data: Mass spectrometry data: ESI-MS m/z: 717 [M$^+$H]$^+$, elementary analysis $C_{44}H_{32}N_2O_4S_2$, C: 73.72, H: 4.50, N: 3.91.

3. The Synthesis of the Compound 1-8

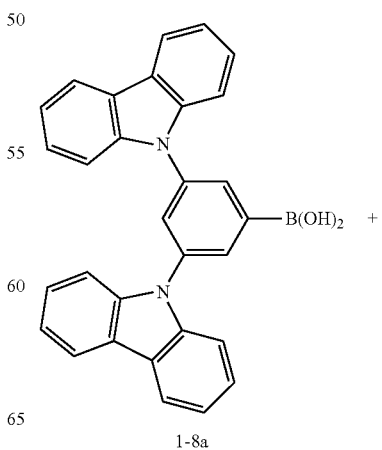

1-8a

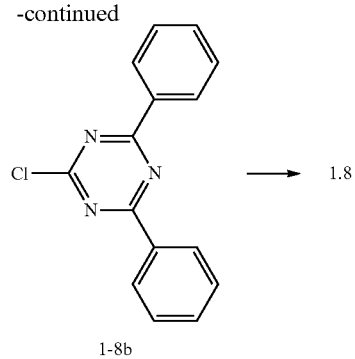

1-8b 4.52 g of 1-8a, 3 g of 1-8b and 0.05 g of tetrakis(triphenylphosphine)palladium, and 5.4 g of potassium carbonate are added into a round bottom flask, and then 30 ml of toluene, 20 ml of water and 5 ml of ethanol are added. The reaction is performed at 85° C. for 48 h. When the reaction ends, the mixture is extracted by using dichloromethane to obtain an organic layer, and then the organic layer is separated by using a chromatographic column to obtain the 1-8, with a yield of 65%.

Mass spectrometry data: ESI-MS m/z: 640 [M$^+$H]$^+$, elementary analysis: $C_{45}H_{29}N_5$, C: 84.48, H: 4.57, N: 10.95.

4. The Synthesis of the Compound 2-1

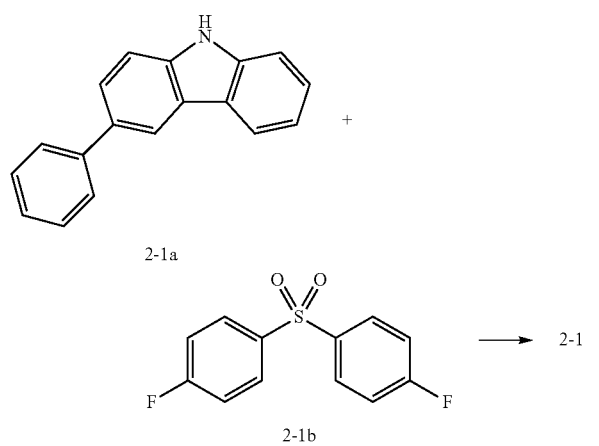

2.43 g of 2-1a is added into an ultra-dry DMF solution (30 ml) of 0.24 g of NaH, and is stirred at room temperature for 30 min. Then a DMF solution of 2.54 g of 2-1b is dropped into the above solution, heated to 100° C., and stirred for 1 hour. After being cooled, the mixture is poured into water, and the solid is filtered, and separated by using a chromatographic column, to obtain 2-1.

Mass spectrometry data: ESI-MS m/z: 701 [M$^+$H]$^+$, elementary analysis: $C_{48}H_{32}N_2O_2S$, C: 82.26, H: 4.60, N: 4.0.

5. The Synthesis of the Compound 2-2

The synthesis of the compound 2-2 can refer to that of 2-1, wherein the method is basically the same as that of the compound 2-1, and the difference is that the 2-1a is replaced by bicarbazole.

Mass spectrometry data: ESI-MS m/z: 879 [M$^+$H]$^+$, elementary analysis: $C_{60}H_{38}N_4O_2S$, C: 81.98, H: 4.36, N: 6.37.

6. The Synthesis of the Compound 2-7

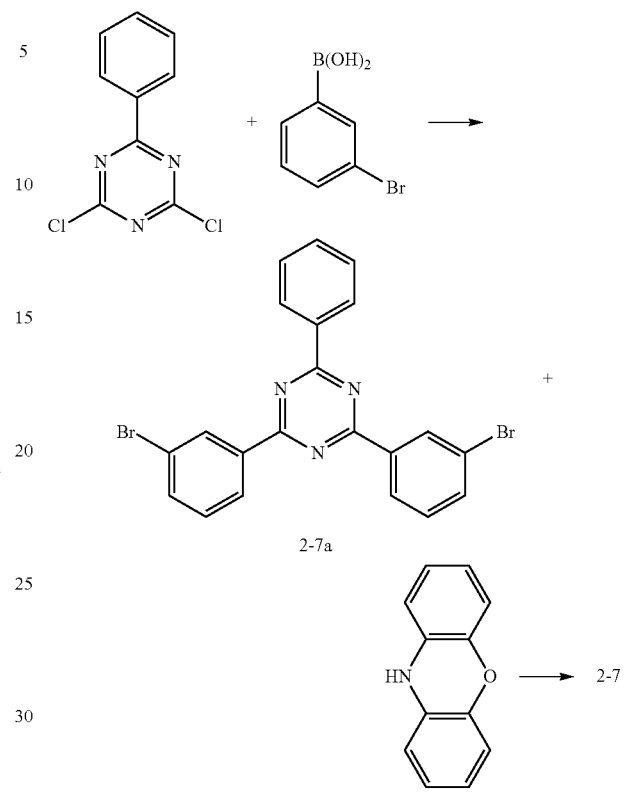

Synthesis 2-7a, 2.25 g of 2,4-dichloro-6-benzotriazine, 2 g of m-bromophenylboronic acid, 0.05 g of tetrakis(triphenylphosphine)palladium, and 5.4 g of potassium carbonate are added into a round bottom flask, and then 30 ml of toluene, 20 ml of water and 5 ml of ethanol are added. The reaction is performed at 85° C. for 48 h. When the reaction ends, the mixture is extracted by using dichloromethane to obtain an organic layer, and then the organic layer is separated by using a chromatographic column to obtain the 2-7a, with a yield of 58%.

Mass spectrometry data: ESI-MS m/z: 466 [M$^+$H]$^+$, elementary analysis: $C_{21}H_{13}Br_2N_3$, C: 53.99, H: 2.80, N: 8.99.

Synthesis 2-7, 4.65 g of 2-7a, 3.66 g of phenoxazine, 0.5 g of CuI, 0.5 g of phenanthroline and 5.2 g of potassium carbonate are added into a 100 ml round bottom flask, and 60 ml of DMF is added. The reaction is performed under a nitrogen atmosphere by heating to reflux for 48 hours. Subsequently the reaction liquid is poured into water, and is subject to vacuum filtration under reduced pressure to obtain a solid. The solid is separated by using a chromatographic column to obtain the 2-7, with a yield of 48%.

Mass spectrometry data: ESI-MS m/z: 672 [M$^+$H]$^+$, elementary analysis: $C_{45}H_{29}N_5O_2$, C: 80.46, H: 4.35, N: 4.76.

7. The Synthesis of the Compound 2-8

Synthesis 2-8a, 2.25 g of 2,4-dichloro-6-benzotriazine, 2 g of p-bromophenylboronic acid, 0.05 g of tetrakis(triphenylphosphine)palladium, and 5.4 g of potassium carbonate are added into a round bottom flask, and then 30 ml of toluene, 20 ml of water and 5 ml of ethanol are added. The reaction is performed at 85° C. for 48 h. When the reaction ends, the mixture is extracted by using dichloromethane to obtain an organic layer, and then the organic layer is separated by using a chromatographic column to obtain the 2-8a, with a yield of 55%.

Mass spectrometry data: ESI-MS m/z: 466 [M$^+$H]$^+$, elementary analysis: $C_{21}H_{13}Br_2N_3$, C: 53.99, H: 2.80, N: 8.99.

Synthesis 2-8, 4.65 g of 2-8a, 3.66 g of phenoxazine, 0.5 g of CuI, 0.5 g of phenanthroline and 5.2 g of potassium carbonate are added into a 100 ml round bottom flask, and 60 ml of DMF is added. The reaction is performed under a nitrogen atmosphere by heating to reflux for 48 hours. Subsequently the reaction liquid is poured into water, and is subject to vacuum filtration under reduced pressure to obtain a solid. The solid is separated by using a chromatographic column to obtain the 2-8, with a yield of 56%.

Mass spectrometry data: ESI-MS m/z: 640 [M$^+$H]$^+$, elementary analysis: $C_{45}H_{29}N_5$, C: 84.48, H: 4.57, N: 10.95.

8. The Synthesis of the Compound 2-9

The synthesis of the 2-9 can refer to that of 2-7, wherein the difference is using a different donor group, by replacing phenoxazine with carbazole. 4.65 g of 2-8a, 3.0 g of carbazole, 0.5 g of CuI, 0.5 g of phenanthroline and 5.2 g of potassium carbonate are added into a 100 ml round bottom flask, and 60 ml of DMF is added. The reaction is performed under a nitrogen atmosphere by heating to reflux for 48 hours. Subsequently the reaction liquid is poured into water, and is subject to vacuum filtration under reduced pressure to obtain a solid. The solid is separated by using a chromatographic column to obtain the 2-9, with a yield of 50%.

Mass spectrometry data: ESI-MS m/z: 640 [M$^+$H]$^+$, elementary analysis: $C_{45}H_{29}N_5$, C: 84.48, H: 4.57, N: 10.95.

9. The Synthesis of the Compound 2-11

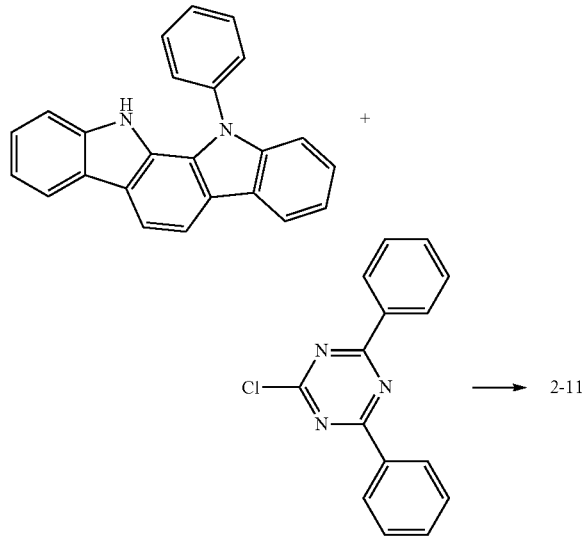

Synthesis 2-11, 3.32 g of phenylindolocarbazole, 2.67 g 2-chloro-4,6-dibenzotriazine, 0.5 g of CuI, 0.5 g of phenanthroline and 5.2 g of potassium carbonate are added into a 100 ml round bottom flask, and 60 ml of DMF is added. The reaction is performed under a nitrogen atmosphere by heating to reflux for 48 hours. Subsequently the reaction liquid is poured into water, and is subject to vacuum filtration under reduced pressure to obtain a solid. The solid is separated by using a chromatographic column to obtain the 2-7, with a yield of 48%.

Mass spectrometry data: ESI-MS m/z: 564 [M$^+$H]$^+$, elementary analysis: $C_{39}H_{25}N_5$, C: 83.10, H: 4.47, N: 12.43.

10. The Synthesis of the Compound 3-3

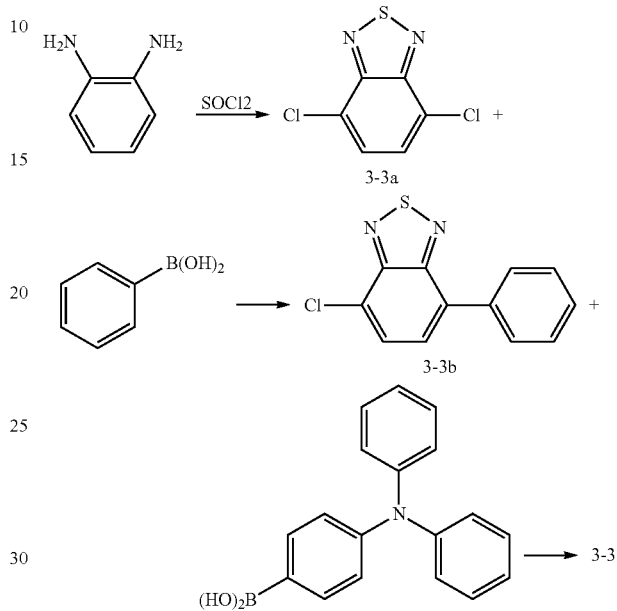

Synthesis 3-3a, 3 ml of pyridine is added into a mixed solution of o-phenylene diamine (0.6 g) and thionyl chloride (5 ml), stirred at 60° C. for 10 hours, extracted by using dichloromethane, and then washed by using a large amount of water to obtain a solid.

Mass spectrometry data: ESI-MS m/z: 205.

Synthesis 3-3b, 2.25 g of 3-3a, 2 g of phenylboronic acid, 0.05 g of tetrakis(triphenylphosphine)palladium, and 5.4 g of potassium carbonate are added into a round bottom flask, and then 30 ml of toluene, 20 ml of water and 5 ml of ethanol are added. The reaction is performed at 85° C. for 48 h. When the reaction ends, the mixture is extracted by using dichloromethane to obtain an organic layer, and then the organic layer is separated by using a chromatographic column to obtain the 3-3a, with a yield of 58%.

Mass spectrometry data: ESI-MS m/z: 246 [M$^+$H]$^+$.

Synthesis 3-3, 2.46 g of 3-3b, 2.39 g of 4-boric acid triphenylamine, 0.05 g of tetrakis(triphenylphosphine)palladium, and 5.4 g of potassium carbonate are added into a round bottom flask, and then 30 ml of toluene, 20 ml of water and 5 ml of ethanol are added. The reaction is performed at 85° C. for 48 h. When the reaction ends, the mixture is extracted by using dichloromethane to obtain an organic layer, and then the organic layer is separated by using a chromatographic column to obtain the 3-3, with a yield of 58%.

Mass spectrometry data: ESI-MS m/z: 456 [M$^+$H]$^+$, elementary analysis: $C_{30}H_{21}N_3S$, C: 79.09, H: 4.65, N: 9.22.

11. The Synthesis of the Compound 3-4

The synthesis of the compound 3-4 can refer to the compound 3-3, wherein the steps are basically the same, and the difference is that the acceptor group is benzothiazole substituted by thiophene.

Mass spectrometry data: ESI-MS m/z: 462 [M+H]+, elementary analysis: $C_{28}H_{19}N_3S_2$: C: 72.86, H: 4.15, N: 9.10.

12. The Synthesis of the Compound 3-5

The synthesis of the compound 3-5 can refer to the compound 3-3, wherein the steps are basically the same, and the difference is that the acceptor group is naphthathiazole substituted by thiophene.

Mass spectrometry data: ESI-MS m/z: 512 [M+H]+, elementary analysis: $C_{32}H_{21}N_3S_2$: C: 75.12, H: 4.15, N: 8.21.

In the organic electroluminescence device of the present invention:

The anode may employ an inorganic material or an organic conductive polymer. The inorganic material may generally employ metal oxides such as indium tin oxide (ITO), zinc oxide (ZnO), and indium zinc oxide (IZO) or metals of high work functions such as gold, copper and silver, preferably ITO. The organic conductive polymer is preferably one of polythiophene/polyvinyl sodium benzenesulfonate (hereafter referred to as simply PEDOT/PSS) and polyaniline (hereafter referred to as simply PANI).

The cathode generally employs metals of low work function such as lithium, magnesium, calcium, strontium, aluminum and indium or their alloys with copper, gold or silver, or an electrode layer that is formed by the alternating of a metal and a metal fluoride. In the present invention the cathode is preferably laminated LiF layer and Al layer (the LiF layer is on the outer side).

The material of the hole transport layer may be selected from lower molecular weight materials of the arylamine type and the branched polymer type, preferably NPB.

The phosphorescent dye may be an organic phosphorescence material containing iridium, platinum or copper, such as $Ir(ppy)_3$, $Ir(ppy)_2acac$, $Ir(MDQ)_2acac$, $Ir(piq)_3$ and $Ir(piq)_2acac$.

The material of the electron transport layer may employ an organic metal complex (such as $Alq_3$, $Gaq_3$, BAlq or Ga(Saph-q)) or other materials that are commonly used for electron transport layer, such as aromatic condensed ring type (such as pentacene and perylene) or o-phenanthroline type (such as $Alq_3$ and BCP) compounds.

The organic electroluminescence device of the present invention may also be provided with a hole injection layer between the anode and the hole transport layer, the material of the hole injection layer may employ, for example, MTDATA (4,4',4''-tris(3-methylphenylaniline)triphenylamine) doped $F_4TCNQ$ or copper phthalocyanine (CuPc), or may be a metal oxide, such as molybdenum oxide.

The thicknesses of the layers may employ the conventional thicknesses of the layers in the art.

The substrate may be glass or a flexible base sheet. The flexible base sheet may employ a polyester type or polyimide type compound material or a thin sheet metal. The laminating and the packaging may employ any suitable method that is known by a person skilled in the art.

The present invention is further illustrated below by the Examples.

For convenience, the abbreviations and full names of some organic materials that are involved in the description are listed as follows:

Abbreviation Full name Structural formula

| Abbreviation | Full name | Structural formula |
|---|---|---|
| $Alq_3$ | tris(8-hydroxylquinoline) aluminum | |
| Balq | di(2-methyl-8-quinolinyl)-4-phenylphenolaluminum (III) | |
| BCP | 2,9-dimethyl-4,7-diphenyl-1,10-o-phenanthroline | |

-continued

| Abbreviation | Full name | Structural formula |
|---|---|---|
| Bphen | 4,7-diphenyl-1,10-o-phenanthroline | |
| C545T | 10-(2-benzothiazole)-1,1,7,7,-tetramethyl-2,3,6,7-tetra-hydro-1H,5H,11H-benzo[1]pyran[6,7,8-ij]quinolizine | |
| CBP | 4,4'-N,N'-dicarbazole-biphenyl | |
| CPF | 9,9-di(4-dicarbazole-phenyl)fluorine | |
| MTDATA | 4,4',4''-tris(3-methylphenyl-aniline)triphenylamine | m-MTDATA |

-continued

| Abbreviation | Full name | Structural formula |
|---|---|---|
| NPB | N,N'-di-(1-naphthyl)-N,N'-diphenyl-1,1'-biphenyl-4,4'-diamine | |
| PBD | 2-(4-tertbutylphenyl)-5-(4-biphenyl)-1,3,4-oxadiazol | |
| pentacene | pentacene | |
| TPD | N,N'-diphenyl-N,N'-bis(m-methylphenyl)-1,1'-biphenyl-4,4'-diamine | |
| perylene | perylene | |
| DCJTB | 4-4-dicyanomethylene-2-tertbutyl-6-(1,1,7,7-tetramethyl-julolidine-9-ethenyl)-4H-pyran | |

| Abbreviation | Full name | Structural formula |
|---|---|---|
| DCM | 4-dicyanomethylene-2-methyl-6-(p-dimethylamino-styrenyl)-4H-pyran | DCM |
| rubrene | 5,6,11,12-tetraphenyl-tetracene | Rubrene |
| DCM-1 | | |
| DMQA | | |
| F$_4$TCNQ | | |

Comparative Example 1

Figure 4:
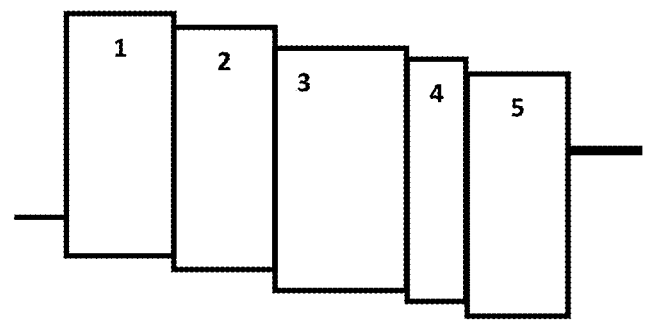
FIG. 4 is the structural representation of the OLED of Comparative Example 1.

The structure of the OLED device of this Comparative Example is as shown in FIG. 4, and comprises: an ITO anode, a hole injection layer 1, a hole transport layer 2, a luminescent layer 3, a barrier layer 4, an electron transport layer 5 and a cathode that are successively laminated and deposited on a substrate (not shown in the figure).

In this Comparative Example, ITO (indium tin oxide) serves as the anode; MTDATA:4% F$_4$TCNQ serves as the hole injection layer 1; TCTA serves as the hole transport layer 2; the luminescent layer 3 employs CBP as the phosphorescence host material, and the green phosphorescence material Ir(ppy)$_3$ serves as the green phosphorescence dye (the doping mass percentage of the dye in the luminescent layer is 10%); BALq serves as the exciton barrier layer 4; Alq$_3$ doped Li$_3$N serves as the electron transport layer 5; and Al serves as the cathode. The structure is as follows:

ITO/MTDATA:4% F$_4$TCNQ(100 nm)/TCTA(20 nm)/CBP: 10% Ir(ppy)$_3$(30 nm)/BAlq(10 nm)/Alq$_3$:2% Li$_3$N(15 nm)/Al(100 nm)

Comparative Example 2

Figure 5:
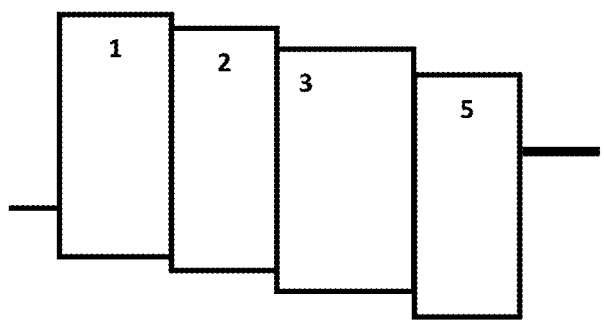
FIG. 5 is the structural representation of the OLED of Comparative Example 2.

The structure of the OLED device of this Comparative Example is as shown in FIG. 5, and comprises: an anode (not shown in the figure), a hole injection layer 1, a hole transport layer 2, a luminescent layer 3, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs CBP as the phosphorescence host material, and the green phosphorescence material Ir(ppy)$_3$ serves as the green phosphorescence dye (the doping mass percentage of the dye in the luminescent layer is 10%); Alq$_3$ doped Li$_3$N serves as the electron transport layer 5; and Al serves as the cathode. Compared with Comparative Example 1, the barrier layer 4 (BALq) is removed.

ITO/MTDATA:4% F$_4$TCNQ(100 nm)/TCTA(20 nm)/CBP:10% Ir(ppy)$_3$(30 nm)/Alq$_3$:2% Li$_3$N(25 nm)/Al(100 nm)

Comparative Example 3

The structure of the OLED device of this Comparative Example is the same as that of Comparative Example 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs the thermally activated delayed fluorescence material HOST (2-13) as the phosphorescence host material, and the green phosphorescence material Ir(ppy)$_3$ serves as the green phosphorescence dye (the doping mass percentage of the dye in the luminescent layer is 10%); BALq serves as the exciton barrier layer 4; Alq$_3$ doped Li$_3$N serves as the electron transport layer 5; and Al serves as the cathode.

ITO/MTDATA:4% F$_4$TCNQ(100 nm)/TCTA(20 nm)/HOST(2-13):10% Ir(ppy)$_3$(30 nm)/BAlq(10 nm)/Alq$_3$:2% Li$_3$N(15 nm)/Al(100 nm)

Example 1

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs the host (2-13) as the phosphorescence host material, and the green phosphorescence material Ir(ppy)$_3$ serves as the green phosphorescence dye (the doping mass percentage of the dye in the luminescent layer is 1%); MTDATA doped Li$_3$N serves as the electron transport layer 5; and Al serves as the cathode.

ITO/MTDATA:4% F$_4$TCNQ(100 nm)/TCTA(20 nm)/host(2-13):1% Ir(ppy)$_3$(30 nm)/Alq$_3$:2% Li$_3$N(25 nm)/Al (100 nm)

Example 2

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs the host (2-13) as the phosphorescence host material, and the green phosphorescence material Ir(ppy)$_3$ serves as the green phosphorescence dye (the doping mass percentage of the dye in the luminescent layer is 5%); MTDATA doped Li$_3$N serves as the electron transport layer 5; and Al serves as the cathode.

ITO/MTDATA:4% F$_4$TCNQ(100 nm)/TCTA(20 nm)/host(2-13):5% Ir(ppy)$_3$(30 nm)/Alq$_3$:2% Li$_3$N(25 nm)/Al (100 nm)

Example 3

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs the host (2-13) as the phosphorescence host material, and the green phosphorescence material Ir(ppy)$_3$ serves as the green phosphorescence dye (the doping mass percentage of the dye in the luminescent layer is 10%); MTDATA doped Li$_3$N serves as the electron transport layer 5; and Al serves as the cathode.

ITO/MTDATA:4% F$_4$TCNQ(100 nm)/TCTA(20 nm)/host(2-13):10% Ir(ppy)$_3$(3 On m)/Alq$_3$:2% Li$_3$N(25 nm)/Al (100 nm)

Example 4

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs the host (2-13) as the phosphorescence host material, and the green phosphorescence material Ir(ppy)$_3$ serves as the green phosphorescence dye (the doping mass percentage of the dye in the luminescent layer is 15%); MTDATA doped Li$_3$N serves as the electron transport layer 5; and Al serves as the cathode.

ITO/MTDATA:4% $F_4TCNQ$(100 nm)/TCTA(20 nm)/host(2-13):15% Ir(ppy)$_3$(3 On m)/Alq$_3$:2% Li$_3$N(25 nm)/Al (100 nm)

The performances of the above devices are as in the following table:

| Serial No. | Brightness cd/m² | Voltage V | Current Efficiency cd/A | Luminous Efficiency lm/W | x (V) | y (V) |
|---|---|---|---|---|---|---|
| Comparative Example 1 | 1000.00 | 3.5 | 45 | 40.3 | 0.31 | 0.60 |
| Comparative Example 2 | 1000.00 | 3.4 | 35 | 32.3 | 0.31 | 0.60 |
| Comparative Example 3 | 1000.00 | 3.1 | 47 | 47.3 | 0.31 | 0.60 |
| Example 1 | 1000.00 | 3.0 | 47 | 49.1 | 0.31 | 0.60 |
| Example 2 | 1000.00 | 2.8 | 49 | 54.9 | 0.31 | 0.60 |
| Example 3 | 1000.00 | 2.7 | 51 | 59.3 | 0.31 | 0.60 |
| Example 4 | 1000.00 | 2.9 | 48 | 51.9 | 0.31 | 0.60 |

It can be seen from Comparative Examples 1 and 2 that, the device efficiencies of the conventional phosphorescence host materials fall largely without the barrier layer.

It can be seen from Comparative Example 3 and Examples 1-4 that, by employing the thermally activated delayed fluorescence materials as the phosphorescence host, when the barrier layer is removed, the current efficiencies of the devices do not fall. Furthermore, because the BAlq barrier layer is removed, the driving voltages of the devices obviously decrease, so the luminous efficiencies are improved to a large extent.

That is mainly because in the thermally activated delayed fluorescence materials part of the triplet state excitons are converted to singlet state excitons. The total concentration of the triplet state excitons and the recombination region become smaller.

The design principle of the above devices may also be applied to the designing of yellow light, red light and even white light.

Therefore, by employing the delayed fluorescence (TADF) material as the phosphorescence host material, the migration radius of the excitons is reduced, and the exciton barrier layer can be eliminated.

Example 5

The structure of this Example is basically the same as that of Example 1, and the differences are only that the luminescent layers employ different TADF materials as the host material, and the doping concentration of the phosphorescent dye Ir(ppy)$_3$ is 10%. The results are as follows:

| Serial No. | TADF Material Employed In the Luminescent layer | Brightness cd/m² | Voltage V | Current Efficiency cd/A | Luminous Efficiency lm/W | x (V) | y (V) |
|---|---|---|---|---|---|---|---|
| OLED1 | 1-12 | 1000.00 | 3.1 | 47 | 47.6 | 0.31 | 0.60 |
| OLED2 | 1-13 | 1000.00 | 2.9 | 46 | 49.8 | 0.31 | 0.60 |
| OLED3 | 2-9 | 1000.00 | 2.8 | 49 | 54.9 | 0.31 | 0.60 |
| OLED4 | 3-7 | 1000.00 | 3.0 | 47 | 49.2 | 0.31 | 0.60 |

The luminescent layer may also be applied to phosphorescence double doping material systems, for example, which are simultaneously doped by a green phosphorescence dye and a red phosphorescence dye.

Comparative Example 4

The structure of the OLED device of this Comparative Example is as shown in FIG. 4, and comprises: an ITO anode, a hole injection layer 1, a hole transport layer 2, a luminescent layer 3, a barrier layer 4, an electron transport layer 5 and a cathode that are successively laminated and deposited on a substrate (not shown in the figure).

In this Comparative Example, ITO (indium tin oxide) serves as the anode; MTDATA:4% $F_4TCNQ$ serves as the hole injection layer 1; TCTA serves as the hole transport layer 2; the luminescent layer 3 employs CBP as the phosphorescence host material, and the green phosphorescence material Ir(ppy)$_3$ serves as the green phosphorescence dye (the doping mass percentage of the dye in the luminescent layer is 10%); and Ir(piq)3 serves as the red phosphorescence dye, whose doping proportion is 1%; BALq serves as the exciton barrier layer 4; Alq$_3$ doped Li$_3$N serves as the electron transport layer 5; and Al serves as the cathode. The structure is as follows:

ITO/MTDATA:4% $F_4TCNQ$(100 nm)/TCTA(20 nm)/CBP:10% Ir(ppy)$_3$:1% Ir(piq)$_3$(30 nm)/BAlq(10 nm)/Alq$_3$:2% Li$_3$N(15 nm)/Al(100 nm)

Comparative Example 5

The structure of the OLED device of this Comparative Example is as shown in FIG. 5, and comprises: an anode (not shown in the figure), a hole injection layer 1, a hole transport layer 2, a luminescent layer 3, an electron transport layer 5 and a cathode (not shown in the figure) that are successively laminated and deposited on a substrate (not shown in the figure).

In this Comparative Example, ITO serves as the anode; MTDATA:4% $F_4TCNQ$ serves as the hole injection layer 1; TCTA serves as the hole transport layer 2; the luminescent layer 3 employs CBP as the phosphorescence host material, and the green phosphorescence material Ir(ppy)$_3$ serves as the green phosphorescence dye (the doping mass percentage of the dye in the luminescent layer is 10%); Ir(piq)$_3$ serves as the red phosphorescence dye, whose doping proportion is 1%; Alq$_3$ doped Li$_3$N serves as the electron transport layer 5; and Al serves as the cathode. Compared with Comparative Example 1, the barrier layer 4 (BALq) is removed.

ITO/MTDATA:4% $F_4TCNQ$(100 nm)/TCTA(20 nm)/CBP:10% Ir(ppy)$_3$:1% Ir(piq)$_3$(30 nm)/Alq$_3$:2% Li$_3$N(25 nm)/Al(100 nm)

Comparative Example 6

The structure of the OLED device of this Comparative Example is the same as that of Comparative Example 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs the thermally activated delayed fluorescence material HOST (1-12) as the phosphorescence host material, and the green phosphorescence material Ir(ppy)$_3$ serves as the green phosphorescence dye (the doping mass percentage of the dye in the luminescent layer is 10%); Ir(piq)$_3$ serves as the red phosphorescence dye, whose doping proportion is 1%; BALq serves as the exciton barrier layer 4; Alq$_3$ doped Li$_3$N serves as the electron transport layer 5; and Al serves as the cathode.

ITO/MTDATA:4% F$_4$TCNQ(100 nm)/TCTA(20 nm)/HOST(1-12):10% Ir(ppy)$_3$:1% Ir(piq)$_3$(30 nm)/BAlq(10 nm)/Alq$_3$:2% Li$_3$N(15 nm)/Al(100 nm)

Example 6

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs the host (1-12) as the phosphorescence host material, and the green phosphorescence material Ir(ppy)$_3$ serves as the green phosphorescence dye (the doping mass percentage of the dye in the luminescent layer is 10%); Ir(piq)$_3$ serves as the red phosphorescence dye, whose doping proportion is 1%; MTDATA doped Li$_3$N serves as the electron transport layer 5; and Al serves as the cathode.

ITO/MTDATA:4% F$_4$TCNQ(100 nm)/TCTA(20 nm)/host(1-12):10% Ir(ppy)$_3$:1% Ir (piq)$_3$(30 nm)/Alq$_3$:2% Li$_3$N (25 nm)/Al(100 nm)

Example 7

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs the host (2-8) as the phosphorescence host material, and the green phosphorescence material Ir(ppy)$_3$ serves as the green phosphorescence dye (the doping mass percentage of the dye in the luminescent layer is 10%); Ir(piq)$_3$ serves as the red phosphorescence dye, whose doping proportion is 1%; MTDATA doped Li$_3$N serves as the electron transport layer 5; and Al serves as the cathode.

ITO/MTDATA:4% F$_4$TCNQ(100 nm)/TCTA(20 nm)/host(2-8):10% Ir(ppy)$_3$:1% Ir(piq)$_3$(30 nm)/Alq$_3$:2% Li$_3$N (25 nm)/Al(100 nm)

Example 8

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs the host (2-12) as the phosphorescence host material, and the green phosphorescence material Ir(ppy)$_3$ serves as the green phosphorescence dye (the doping mass percentage of the dye in the luminescent layer is 10%); Ir(piq)$_3$ serves as the red phosphorescence dye, whose doping proportion is 1%; MTDATA doped Li$_3$N serves as the electron transport layer 5; and Al serves as the cathode.

ITO/MTDATA:4% F$_4$TCNQ(100 nm)/TCTA(20 nm)/host(2-12):10% Ir(ppy)$_3$:1% Ir (piq)$_3$(30 nm)/Alq$_3$:2% Li$_3$N (25 nm)/Al(100 nm)

Example 9

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% F$_4$TCNQ serves as the hole injection layer 1; TCTA serves as the hole transport layer 2; the luminescent layer 3 employs the host (3-1) as the phosphorescence host material, and the green phosphorescence material Ir(ppy)$_3$ serves as the green phosphorescence dye (the doping mass percentage of the dye in the luminescent layer is 10%); Ir(piq)$_3$ serves as the red phosphorescence dye, whose doping proportion is 1%; MTDATA doped Li$_3$N serves as the electron transport layer 5; and Al serves as the cathode.

ITO/MTDATA:4% F$_4$TCNQ(100 nm)/TCTA(20 nm)/host(3-1):10% Ir(ppy)$_3$:1% Ir(piq)$_3$(30 nm)/Alq$_3$:2% Li$_3$N (25 nm)/Al(100 nm)

The performances of the above devices are as in the following table:

| Serial No. | Brightness cd/m$^2$ | Voltage V | Current Efficiency cd/A | Luminous Efficiency lm/W | x (V) | y (V) |
|---|---|---|---|---|---|---|
| Comparative Example 4 | 1000.00 | 3.4 | 41 | 37.8 | 0.50 | 0.47 |
| Comparative Example 5 | 1000.00 | 3.2 | 33 | 32.4 | 0.49 | 0.48 |
| Comparative Example 6 | 1000.00 | 3.1 | 44 | 44.5 | 0.49 | 0.47 |
| Example 6 | 1000.00 | 3.1 | 41 | 41.1 | 0.51 | 0.46 |
| Example 7 | 1000.00 | 3.2 | 45 | 44.1 | 0.49 | 0.48 |
| Example 8 | 1000.00 | 3.0 | 48 | 50.2 | 0.48 | 0.47 |
| Example 9 | 1000.00 | 2.9 | 46 | 49.8 | 0.47 | 0.47 |

It can be seen from Comparative Examples 4 and 5 that, in the host-doped-by-double phosphorescence luminescence systems, the device efficiencies of the conventional phosphorescence host materials fall largely without the barrier layer.

It can be seen from Comparative Example 6 and Examples 6-9 that, by employing the thermally activated delayed fluorescence materials as the phosphorescence host, when the barrier layer is removed, the current efficiencies of the devices do not fall. Furthermore, because the BAlq barrier layer is removed, the driving voltages of the devices obviously decrease, so the luminous efficiencies are improved to a large extent.

The luminescence host may also be applied to host-doped-by-phosphorescence doping luminescent material systems, in which the phosphorescent dye has the function of energy sensitization.

Comparative Example 7

The structure of the OLED device of this Comparative Example is as shown in FIG. 4, and comprises: an ITO anode, a hole injection layer 1, a hole transport layer 2, a luminescent layer 3, a barrier layer 4, an electron transport layer 5 and a cathode that are successively laminated and deposited on a substrate (not shown in the figure).

In this Comparative Example, ITO (indium tin oxide) serves as the anode; MTDATA:4% $F_4TCNQ$ serves as the hole injection layer 1; TCTA serves as the hole transport layer 2; the luminescent layer 3 employs CBP as the phosphorescence host material, and the green phosphorescence material Ir(ppy)$_3$ serves as the green phosphorescence dye (the doping mass percentage of the dye in the luminescent layer is 10%); Rurene serves as the red phosphorescence dye, whose doping proportion is 1%; BALq serves as the exciton barrier layer 4; Alq$_3$ doped Li$_3$N serves as the electron transport layer 5; and Al serves as the cathode. The structure is as follows:

ITO/MTDATA:4% $F_4TCNQ$(100 nm)/TCTA(20 nm)/CBP:10% Ir(ppy)$_3$:1% Rurene(30 nm)/BAlq(10 nm)/Alq$_3$:2% Li$_3$N(15 nm)/Al(100 nm)

Comparative Example 8:

The structure of the OLED device of this Comparative Example is as shown in FIG. 5, and comprises: an anode (not shown in the figure), a hole injection layer 1, a hole transport layer 2, a luminescent layer 3, an electron transport layer 5 and a cathode (not shown in the figure) that are successively laminated and deposited on a substrate (not shown in the figure).

In this Comparative Example, ITO serves as the anode; MTDATA:4% $F_4TCNQ$ serves as the hole injection layer 1; TCTA serves as the hole transport layer 2; the luminescent layer 3 employs CBP as the phosphorescence host material, and the green phosphorescence material Ir(ppy)$_3$ serves as the green phosphorescence dye (the doping mass percentage of the dye in the luminescent layer is 10%); Rurene serves as the red phosphorescence dye, whose doping proportion is 1%; Alq$_3$ doped Li$_3$N serves as the electron transport layer 5; and Al serves as the cathode. Compared with Comparative Example 1, the barrier layer 4 (BALq) is removed.

ITO/MTDATA:4% $F_4TCNQ$(100 nm)/TCTA(20 nm)/CBP:10% Ir(ppy)$_3$:1% Rurene (30 nm)/Alq$_3$:2% Li$_3$N(25 nm)/Al(100 nm)

Comparative Example 9:

The structure of the OLED device of this Comparative Example is the same as that of Comparative Example 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% $F_4TCNQ$ serves as the hole injection layer 1; TCTA serves as the hole transport layer 2; the luminescent layer 3 employs the thermally activated delayed fluorescence material HOST (1-13) as the phosphorescence host material, and the green phosphorescence material Ir(ppy)$_3$ serves as the green phosphorescence dye (the doping mass percentage of the dye in the luminescent layer is 10%); Rurene serves as the red phosphorescence dye, whose doping proportion is 1%; BALq serves as the exciton barrier layer 4; Alq$_3$ doped Li$_3$N serves as the electron transport layer 5; and Al serves as the cathode.

ITO/MTDATA:4% $F_4TCNQ$(100 nm)/TCTA(20 nm)/HOST(1-13):10% Ir(ppy)$_3$:1% Rurene(30 nm)/BAlq(10 nm)/Alq$_3$:2% Li$_3$N(15 nm)/Al(100 nm)

Example 10:

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% $F_4TCNQ$ serves as the hole injection layer 1; TCTA serves as the hole transport layer 2; the luminescent layer 3 employs the host (1-13) as the phosphorescence host material, and the green phosphorescence material Ir(ppy)$_3$ serves as the green phosphorescence dye (the doping mass percentage of the dye in the luminescent layer is 10%); Rurene serves as the red phosphorescence dye, whose doping proportion is 1%; MTDATA doped Li$_3$N serves as the electron transport layer 5; and Al serves as the cathode.

ITO/MTDATA:4% $F_4TCNQ$(100 nm)/TCTA(20 nm)/host(1-13):10% Ir(ppy)$_3$:1% Rurene(30 nm)/Alq$_3$:2% Li$_3$N (25 nm)/Al(100 nm)

Example 11:

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% $F_4TCNQ$ serves as the hole injection layer 1; TCTA serves as the hole transport layer 2; the luminescent layer 3 employs the host (2-10) as the phosphorescence host material, and the green phosphorescence material Ir(ppy)$_3$ serves as the green phosphorescence dye (the doping mass percentage of the dye in the luminescent layer is 10%); Rurene serves as the red phosphorescence dye, whose doping proportion is 1%; MTDATA doped Li$_3$N serves as the electron transport layer 5; and Al serves as the cathode.

ITO/MTDATA:4% $F_4TCNQ$(100 nm)/TCTA(20 nm)/host(2-10):10% Ir(ppy)$_3$:1% Rurene(30 nm)/Alq$_3$:2% Li$_3$N (25 nm)/Al(100 nm)

Example 12

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% $F_4$TCNQ serves as the hole injection layer 1; TCTA serves as the hole transport layer 2; the luminescent layer 3 employs the host (2-14) as the phosphorescence host material, and the green phosphorescence material Ir(ppy)$_3$ serves as the green phosphorescence dye (the doping mass percentage of the dye in the luminescent layer is 10%); Rurene serves as the red phosphorescence dye, whose doping proportion is 1%; MTDATA doped Li$_3$N serves as the electron transport layer 5; and Al serves as the cathode.

ITO/MTDATA:4% $F_4$TCNQ(100 nm)/TCTA(20 nm)/host(2-14):10% Ir(ppy)$_3$:1% Rurene(30 nm)/Alq$_3$:2% Li$_3$N (25 nm)/Al(100 nm)

Example 13

The structure of the OLED device of this Example is as shown in FIG. 1, and comprises: an anode, a hole injection layer 1, a hole transport layer 2, a luminescent layer 3, a barrier layer 4, an electron transport layer 5 and a cathode (not shown in the figure) that are successively laminated and deposited on a substrate (not shown in the figure).

In this Comparative Example, ITO serves as the anode; MTDATA:4% $F_4$TCNQ serves as the hole injection layer 1; TCTA serves as the hole transport layer 2; the luminescent layer 3 employs the host (3-3) as the phosphorescence host material, and the green phosphorescence material Ir(ppy)$_3$ serves as the green phosphorescence dye (the doping mass percentage of the dye in the luminescent layer is 10%); Rurene serves as the red phosphorescence dye, whose doping proportion is 1%; MTDATA doped Li$_3$N serves as the electron transport layer 5; and Al serves as the cathode.

ITO/MTDATA:4% $F_4$TCNQ(100 nm)/TCTA(20 nm)/host(3-3):10% Ir(ppy)$_3$:1% Rurene(30 nm)/Alq$_3$:2% Li$_3$N (25 nm)/Al(100 nm)

The performances of the above devices are as in the following table:

| Serial No. | Brightness cd/m$^2$ | Voltage V | Current Efficiency cd/A | Luminous Efficiency lm/W | x (V) | y (V) |
|---|---|---|---|---|---|---|
| Comparative Example 7 | 1000.00 | 3.4 | 30.5 | 37.8 | 0.54 | 0.47 |
| Comparative Example 8 | 1000.00 | 3.2 | 25.5 | 32.4 | 0.53 | 0.46 |
| Comparative Example 9 | 1000.00 | 3.1 | 35.5 | 44.5 | 0.55 | 0.46 |
| Example 10 | 1000.00 | 3.2 | 37.4 | 41.1 | 0.54 | 0.47 |
| Example 11 | 1000.00 | 3.1 | 33.3 | 44.1 | 0.54 | 0.48 |
| Example 12 | 1000.00 | 3.1 | 36.2 | 50.2 | 0.55 | 0.46 |
| Example 13 | 1000.00 | 2.8 | 35.7 | 49.8 | 0.54 | 0.47 |

It can be seen from Comparative Examples 7 and 8 that, in the host-doped-by-phosphorescence materials and the fluorescence systems, the device efficiencies of the conventional phosphorescence host materials fall largely without the barrier layer. The device efficiencies of the light host materials fall largely without the barrier layer.

It can be seen from Comparative Example 9 and Examples 10-13 that, by employing the thermally activated delayed fluorescence materials as the phosphorescence host, when the barrier layer is removed, the current efficiencies of the devices do not fall. Furthermore, because the BAlq barrier layer is removed, the driving voltages of the devices obviously decrease, so the luminous efficiencies are improved to a large extent.

The designing of organic light emitting devices is required to comprehensively take into account the transferring and equilibration of charge carriers, the distribution of the recombination interface, and so on. By detailed and intensive studying, we find that, by employing the luminescence structures and material systems of the present patent, the performances of the devices are greatly improved, and the key to the structure simplification and the performance improving is to, by using the thermally activated delayed fluorescence material, regulate and control the concentration of the triplet state excitons and in turn control the recombination region.

The above examples are merely preferred examples that are presented to fully illustrate the present invention, and the protection scope of the present invention is not limited thereto. The equivalent substitutions or alternations that are made by a person skilled in the art on the basis of the present invention all fall within the protection scope of the present invention. The protection scope of the present invention is limited by the claims.

The invention claimed is:

1. An organic electroluminescence device, comprising a luminescent layer, wherein, a host material of the luminescent layer comprises a thermally activated delayed fluorescence material, the host material is doped by a dye, the dye is formed by combining a phosphorescent dye and a fluorescent dye, a doping mass percentage of the fluorescent dye in the luminescent layer is 1%-5%.

2. The organic electroluminescence device according to claims 1, wherein, an energy gap between a triplet state energy level and a singlet state energy level of the thermally activated delayed fluorescence material is <0.3eV.

3. The organic electroluminescence device according to claim 1, wherein, an energy gap between a triplet state energy level and a singlet state energy level of the thermally activated delayed fluorescence material is <0.15eV.

4. The organic electroluminescence device according to claim 1, wherein, a lumo orbit and a homo orbit of the thermally activated delayed fluorescence material distribute on different groups in its molecular structure.

5. The organic electroluminescence device according to claim 1, wherein, the thermally activated delayed fluorescence material is a material that has charge transfer transition, and the thermally activated delayed fluorescence material has both a donor group unit and an acceptor group unit therein, the donor group unit is a donor group or a group that is formed by linking two or more donor groups;

the acceptor group unit is an acceptor group or a group that is formed by linking two or more acceptor groups;

the donor group is selected from indolocarbazolyl, carbazolyl, bicarbazolyl, trianilino, phenoxazinyl, indolocarbazolyl that is substituted by one or more groups of C1-6 alkyl, methoxy, ethoxy or phenyl, carbazolyl that is substituted by one or more groups of C1-6 alkyl, methoxy, ethoxy or phenyl, bicarbazolyl that is substituted by one or more groups of C1-6 alkyl, methoxy, ethoxy or phenyl, trianilino that is substituted by one or more groups of C1-6 alkyl, methoxy, ethoxy or phenyl, or phenoxazinyl that is substituted by one or more groups of C1-6 alkyl, methoxy, ethoxy or phenyl; and the acceptor group is selected from naphthyl, anthracenyl, phenanthrenyl, pyrenyl, triazinyl, benzimidazolyl, cyano, pyridinyl, sulfonyl, phenanthroimidazolyl, naphthathiazolyl, benzothiazolyl, oxadiazolyl, naphthyl that is substituted by one or more groups of C1-6 alkyl, methoxy, ethoxy, phenyl or pyridinyl, anthracenyl that is substituted by one or more groups of C1-6 alkyl, methoxy, ethoxy, phenyl or pyridinyl, phenanthrenyl that is substituted by one or more groups of C1-6 alkyl, methoxy, ethoxy, phenyl or pyridinyl, pyrenyl that is substituted by one or more groups of C1-6 alkyl, methoxy, ethoxy, phenyl or pyridinyl, triazinyl that is substituted by one or more groups of C1-6 alkyl, methoxy, ethoxy, phenyl or pyridinyl, benzimidazolyl that is substituted by one or more groups of C1-6 alkyl, methoxy, ethoxy, phenyl or pyridinyl, pyridinyl that is substituted by one or more groups of C1-6 alkyl, methoxy, ethoxy, phenyl or pyridinyl, sulfonyl that is substituted by one or more groups of C1-6 alkyl, methoxy, ethoxy, phenyl or pyridinyl, phenanthroimidazolyl that is substituted by one or more groups of C1-6 alkyl, methoxy, ethoxy, phenyl or pyridinyl, naphthathiazolyl that is substituted by one or more groups of C1-6 alkyl, methoxy, ethoxy, phenyl or pyridinyl, benzothiazolyl that is substituted by one or more groups of C1-6 alkyl, methoxy, ethoxy, phenyl or pyridinyl, and oxadiazolyl that is substituted by one or more groups of C1-6 alkyl, methoxy, ethoxy, phenyl or pyridinyl;

wherein, one or more of the donor group units and one or more of the acceptor group units directly link to form the host material; or, one or more of the donor group units and one or more of the acceptor group units individually link to a linking group to form the host material, wherein the linking group is a group that has a steric hindrance.

6. The organic electroluminescence device according to claim 5, wherein, one or two of the donor group units and one or two of the acceptor group units individually link to the linking group to form the thermally activated delayed fluorescence material, or one or two of the acceptor group units and one or two of the donor group units directly link to form the thermally activated delayed fluorescence material.

7. The organic electroluminescence device according to claim 5, wherein, the linking group is selected from spirofluorenyl, phenyl, biphenyl, spirofluorenyl that is substituted by at least one of C1-6 alkyl or phenyl, phenyl that is substituted by at least one of C1-6 alkyl or phenyl, and biphenyl that is substituted by at least one of C1-6 alkyl or phenyl.

8. The organic electroluminescence device according to claim 5, wherein, the donor group is selected from the following groups:

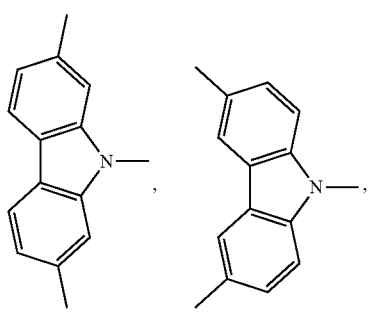

-continued

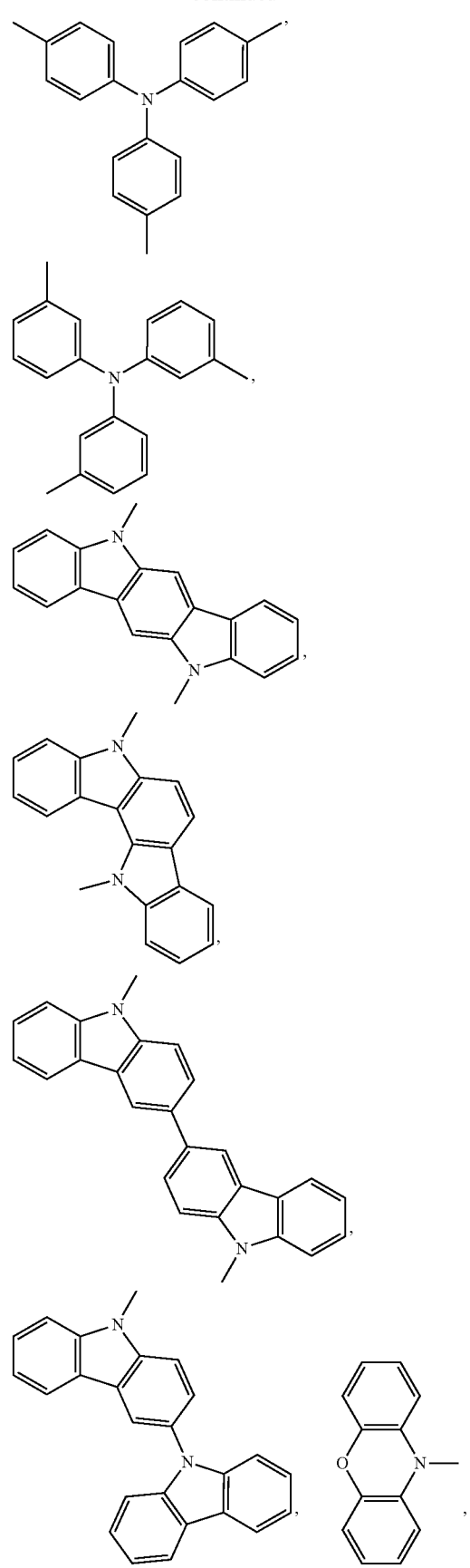

-continued
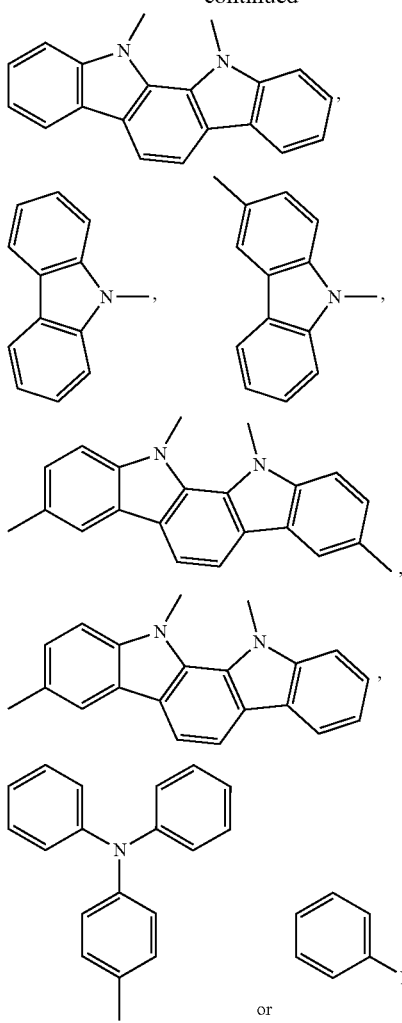
and
the acceptor group is selected from the following groups:
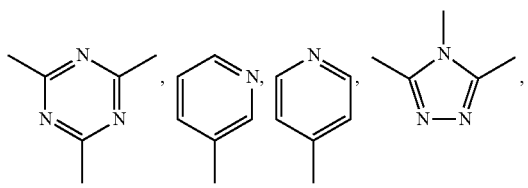
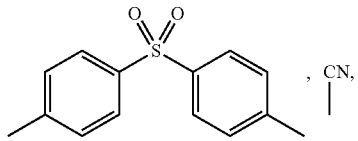
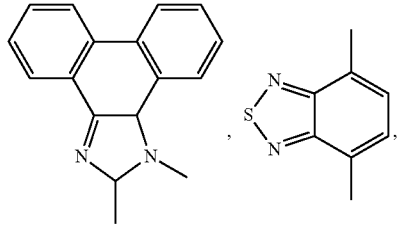
-continued
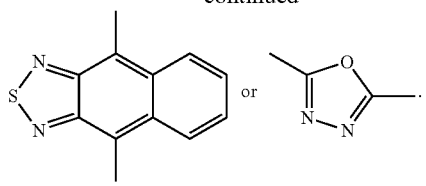
9. The organic electroluminescence device according to claim 5, wherein, the thermally activated delayed fluorescence material has any one of the following structures:
1-3
1-4
1-5
1-6

-continued
1-7
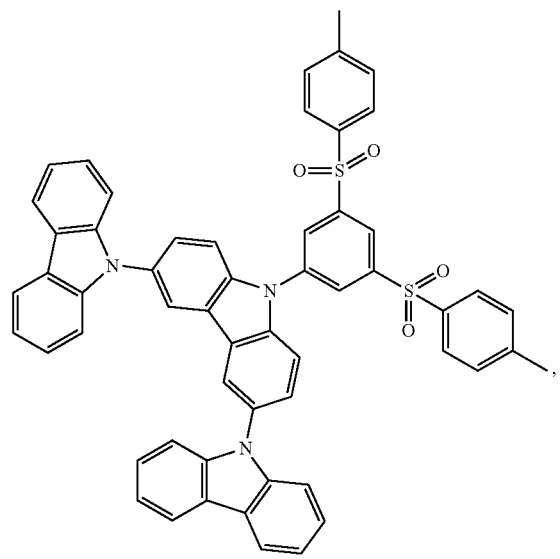
1-8
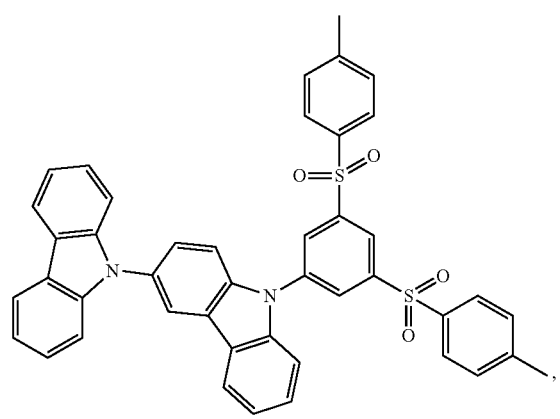
1-12
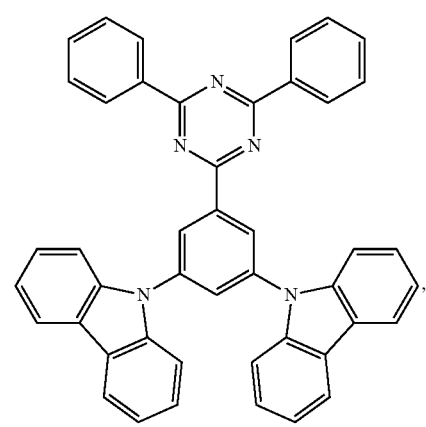
-continued
2-1
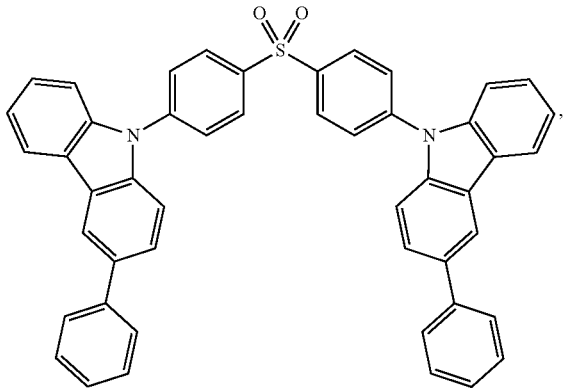
2-2
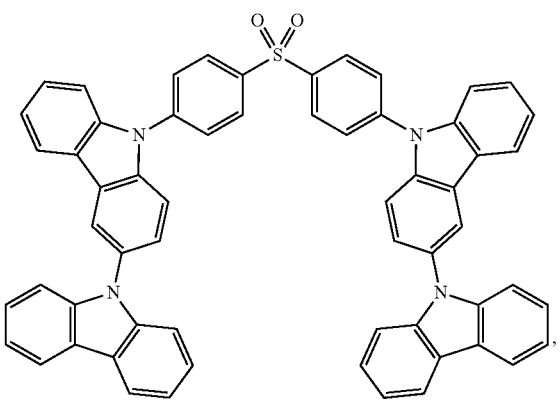
2-3
2-4
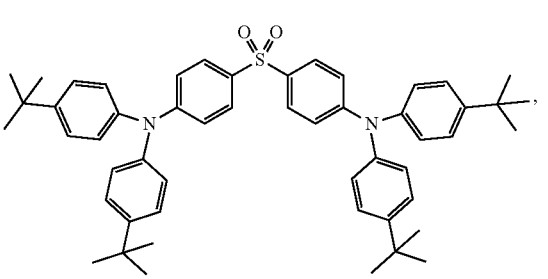

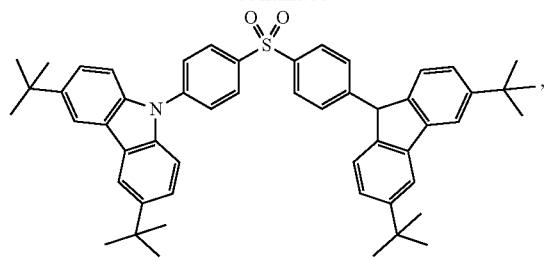
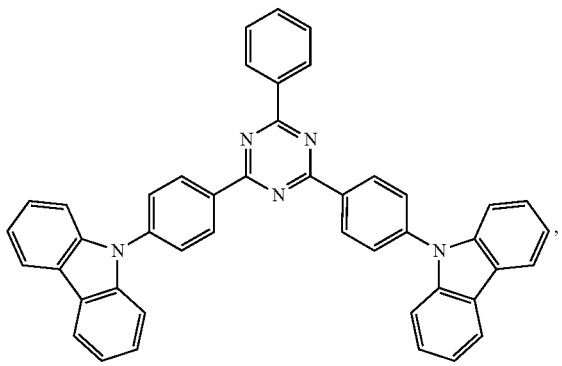
2-8
2-5
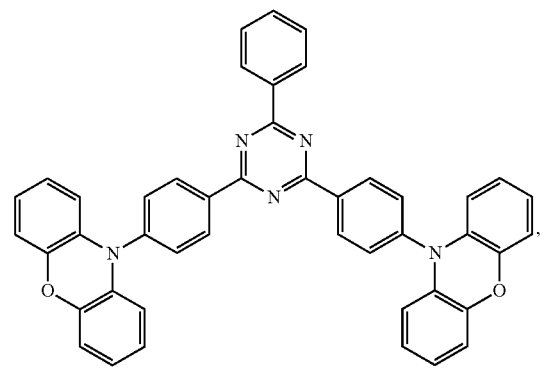
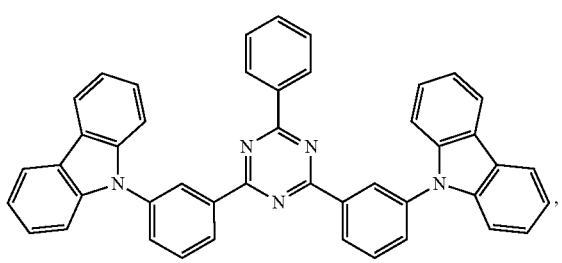
2-9
2-6
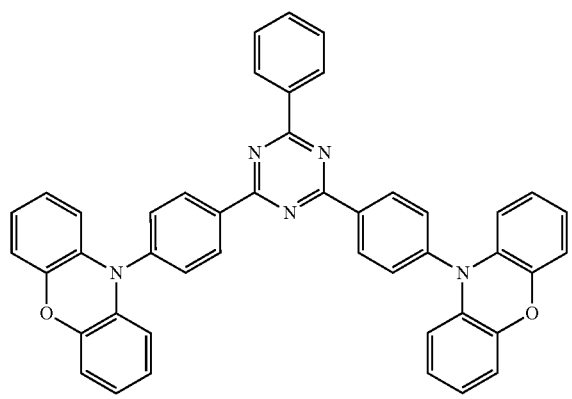
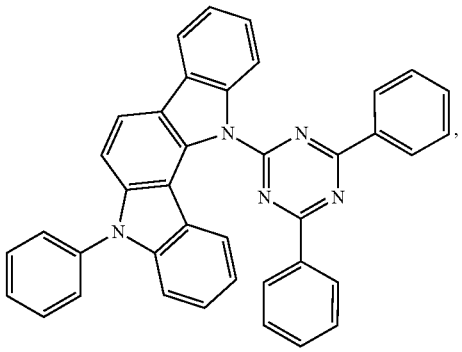
2-10
2-7
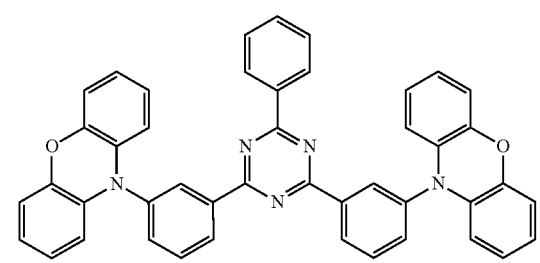
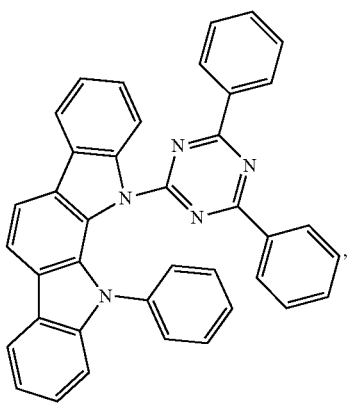
2-11

2-13
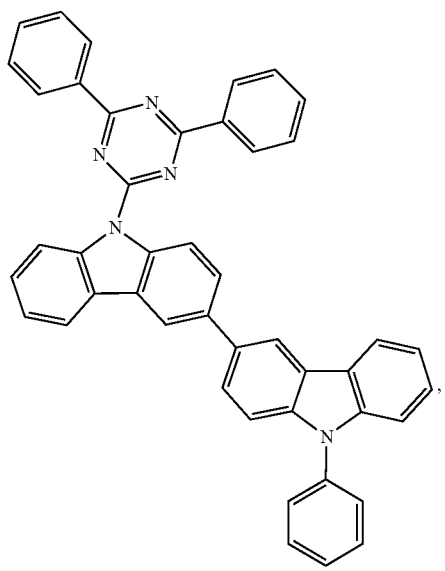
2-14
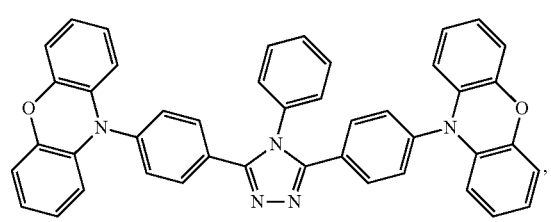
2-15
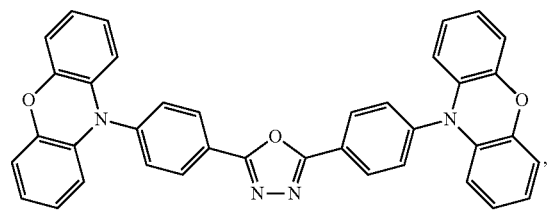
3-1
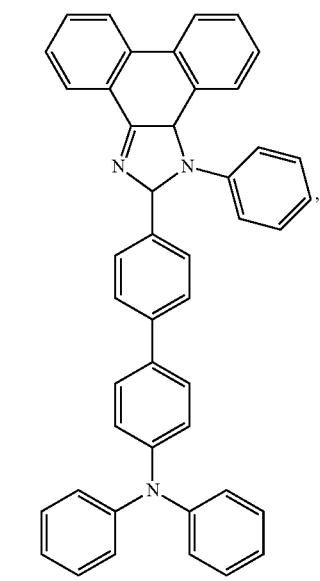
3-2
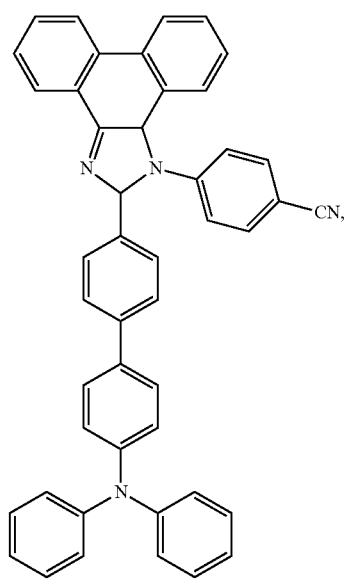
3-3
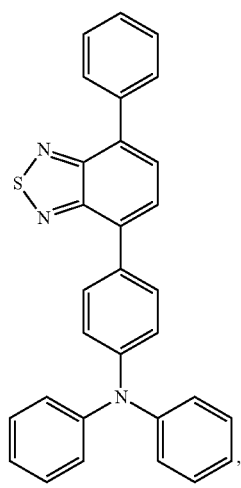
3-4
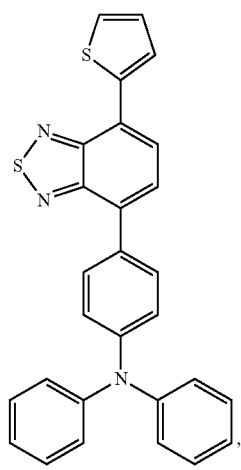

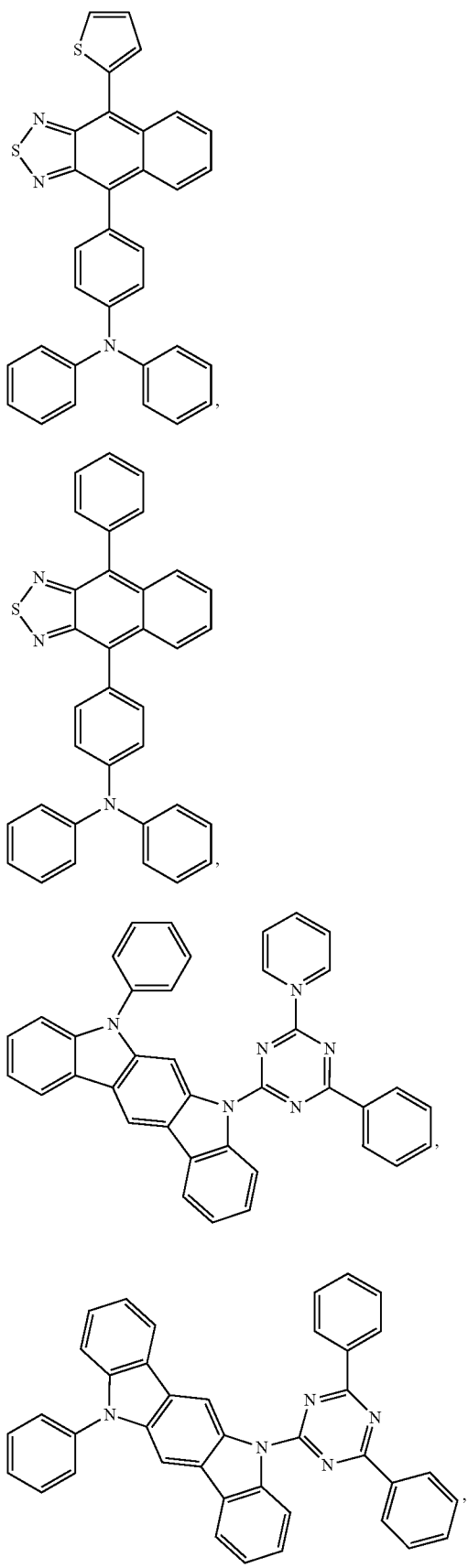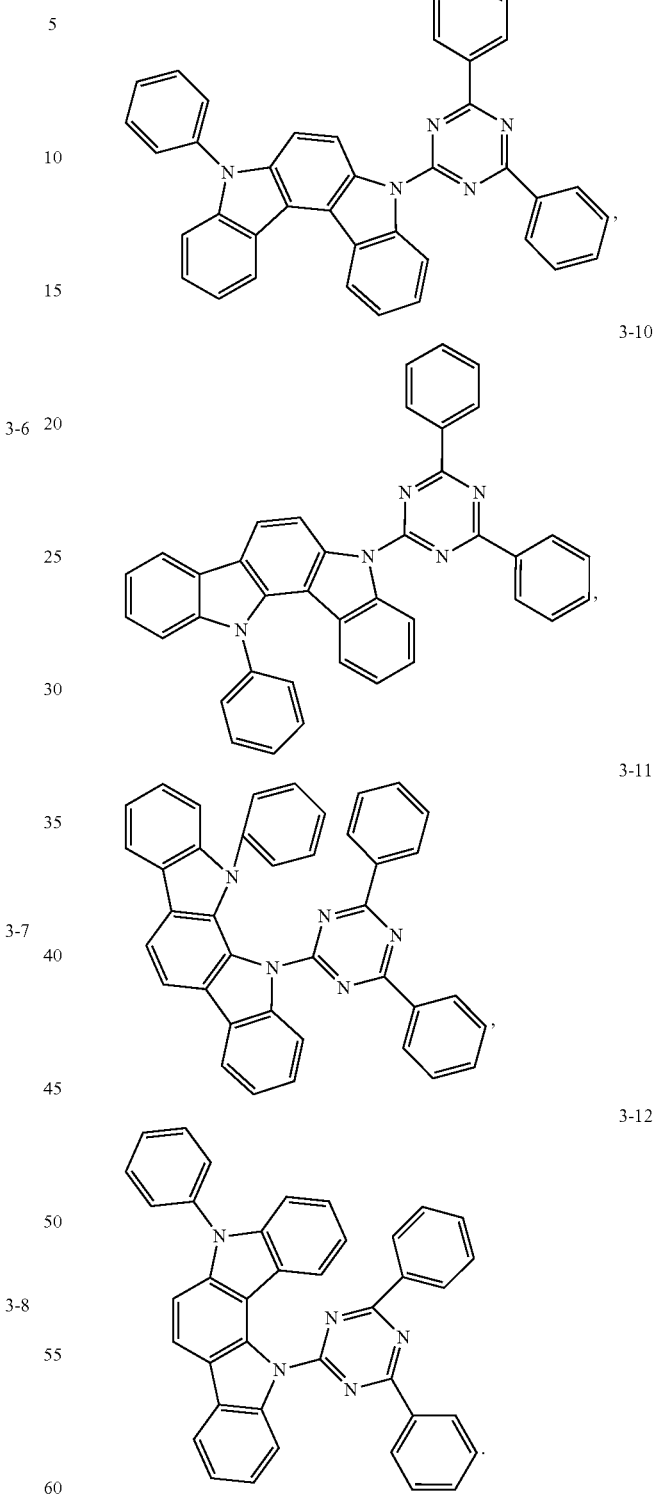
10. The organic electroluminescence device according to claim 1, wherein, the organic electroluminescence device is formed by successively laminating and depositing an anode, a hole injection layer, a hole transport layer, the luminescent layer, an electron transport layer and a cathode on a substrate; or, the organic electroluminescence device is formed by successively laminating and depositing an cathode, an electron transport layer, the luminescent layer, a hole transport layer, a hole injection layer and an anode on a substrate.

\* \* \* \* \*